(12) United States Patent
Nakatsu

(10) Patent No.: US 11,881,684 B2
(45) Date of Patent: *Jan. 23, 2024

(54) SEMICONDUCTOR LASER ELEMENT AND METHOD FOR MANUFACTURING THE SAME

(71) Applicant: NICHIA CORPORATION, Anan (JP)

(72) Inventor: Yoshitaka Nakatsu, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/685,820

(22) Filed: Mar. 3, 2022

(65) Prior Publication Data

US 2022/0271510 A1    Aug. 25, 2022

Related U.S. Application Data

(63) Continuation of application No. 16/742,240, filed on Jan. 14, 2020, now Pat. No. 11,296,485.

(30) Foreign Application Priority Data

Jan. 17, 2019  (JP) .................................. 2019-005760
Jul. 31, 2019  (JP) .................................. 2019-141147

(51) Int. Cl.
*H01S 5/343* (2006.01)
*H01S 5/20* (2006.01)
(Continued)

(52) U.S. Cl.
CPC ...... *H01S 5/34333* (2013.01); *H01S 5/04253* (2019.08); *H01S 5/2031* (2013.01);
(Continued)

(58) Field of Classification Search
CPC ........ H01S 5/2009; H01S 5/2031; H01S 5/22; H01S 5/34333
See application file for complete search history.

(56) References Cited

U.S. PATENT DOCUMENTS 4,426,703 A * 1/1984 Kuroda ................. H01S 5/2231
                                                372/43.01
5,294,833 A * 3/1994 Schetzina ............. H01S 5/0421
                                                257/749
(Continued)

FOREIGN PATENT DOCUMENTS

JP       2002-261395 A     9/2002
JP       2003-273473 A     9/2003
(Continued)

OTHER PUBLICATIONS

Bergmann et al., "Optical-field calculations for lossy multiple-layer $AL_xGa_{1-x}N/In_xGa_{1-x}N$ laser diodes", Journal of Applied Physics, Aug. 1, 1998, pp. 1196-1203, vol. 84, No. 3, American Institute of Physics.

(Continued)

*Primary Examiner* — Michael Carter
(74) *Attorney, Agent, or Firm* — Foley & Lardner LLP

(57) ABSTRACT

A semiconductor laser element includes: an n-side semiconductor layer formed of a nitride semiconductor; an active layer disposed on or above the n-side semiconductor layer and formed of a nitride semiconductor; a p-side semiconductor layer disposed on the active layer, formed of a nitride semiconductor, and including: an undoped first part disposed in contact with an upper face of the active layer and comprising at least one semiconductor layer, an electron barrier layer disposed in contact with an upper face of the first part, containing a p-type impurity, and having a band gap energy that is larger than a band gap energy of the first part, and a second part disposed in contact with the upper face of the electron barrier layer and comprising at least one p-type semiconductor layer containing a p-type impurity; and a p-electrode disposed in contact with the upper face of the second part.

9 Claims, 17 Drawing Sheets

(51) Int. Cl.
*H01S 5/22* (2006.01)
*H01S 5/042* (2006.01)

(52) U.S. Cl.
CPC ........ *H01S 5/2206* (2013.01); *H01S 5/34346* (2013.01); *H01S 5/2009* (2013.01); *H01S 2304/04* (2013.01)

(56) References Cited

U.S. PATENT DOCUMENTS

| | | | |
|---|---|---|---|
| 5,592,502 A * | 1/1997 | Matsumoto | H01S 5/2231 |
| | | | 372/45.01 |
| 7,184,207 B1 * | 2/2007 | Walker | G02F 1/025 |
| | | | 359/344 |
| 11,296,485 B2 * | 4/2022 | Nakatsu | H01S 5/2031 |
| 2004/0056259 A1 | 3/2004 | Goto et al. | |
| 2005/0127391 A1 | 6/2005 | Yanamoto | |
| 2006/0273326 A1 | 12/2006 | Goto et al. | |
| 2007/0290230 A1 | 12/2007 | Kawaguchi et al. | |
| 2008/0108160 A1 | 5/2008 | Goto et al. | |
| 2008/0117945 A1 | 5/2008 | Kuramoto | |
| 2008/0203418 A1 | 8/2008 | Yanamoto | |
| 2010/0008391 A1 | 1/2010 | Nakagawa et al. | |
| 2010/0087022 A1 | 4/2010 | Kuramoto | |
| 2011/0183452 A1 | 7/2011 | Goto et al. | |
| 2012/0140785 A1 | 6/2012 | Nakagawa et al. | |
| 2012/0273816 A1 | 11/2012 | Yoshida et al. | |
| 2013/0142210 A1 | 6/2013 | Kyono et al. | |
| 2013/0223463 A1 | 8/2013 | Kawaguchi et al. | |
| 2013/0230936 A1 | 9/2013 | Goto et al. | |
| 2014/0294029 A1 | 10/2014 | Masui | |
| 2015/0229105 A1 | 8/2015 | Masui | |
| 2015/0255956 A1 | 9/2015 | Strau et al. | |
| 2016/0352077 A1 | 12/2016 | Kasahara | |
| 2017/0155230 A1 | 6/2017 | Nakatsu | |
| 2017/0237226 A1 * | 8/2017 | Johnson | H01S 5/0265 |
| | | | 385/2 |
| 2018/0131161 A1 * | 5/2018 | Kawaguchi | H01S 5/323 |
| 2019/0237938 A1 | 8/2019 | Kasahara | |

FOREIGN PATENT DOCUMENTS

| | | |
|---|---|---|
| JP | 2005-109524 A | 4/2005 |
| JP | 2008-124110 A | 5/2008 |
| JP | 2009-277844 A | 11/2009 |
| JP | 2012-209352 A | 10/2012 |
| JP | 2013-093382 A | 5/2013 |
| JP | 2014-131019 A | 7/2014 |
| JP | 2015-530753 A | 10/2015 |
| JP | 2016-219722 A | 12/2016 |
| JP | 2018-050021 A | 3/2018 |
| JP | 2018-137327 A | 8/2018 |
| JP | 2018-200928 A | 12/2018 |
| WO | WO-2005/034301 A | 4/2005 |
| WO | WO-2017/017928 A1 | 2/2017 |

OTHER PUBLICATIONS

Non-Final Office Action on U.S. Appl. No. 16/742,240 dated Aug. 19, 2021.

Notice of Allowance on U.S. Appl. No. 16/742,240 dated Dec. 6, 2021.

* cited by examiner

SEMICONDUCTOR LASER ELEMENT AND METHOD FOR MANUFACTURING THE SAME

CROSS-REFERENCE TO RELATED APPLICATIONS

The present application is a continuation of U.S. patent application Ser. No. 16/742,240, filed on Jan. 14, 2020, which claims priority to Japanese Patent Application No. 2019-005760, filed on Jan. 17, 2019, and Japanese Patent Application No. 2019-141147, filed on Jul. 31, 2019, the disclosures of which are hereby incorporated by reference in their entireties.

BACKGROUND

The present disclosure relates to a semiconductor laser element and a method for manufacturing the same.

Today, semiconductor laser elements having nitride semiconductors (hereinafter also referred to as "nitride semiconductor laser elements") can emit a spectrum of light from ultraviolet to green, and are utilized in a broad range of applications besides light sources for optical disks. For such semiconductor laser elements, a structure in which an n-side clad layer, an n-side optical guide layer, an active layer, a p-side optical guide layer, and a p-side clad layer are disposed on a substrate in that order has been described. See, for example, Japanese Patent Publication No. 2003-273473, Japanese Patent Publication No. 2014-131019, and PCT Publication No. 2017/017928.

SUMMARY

In some semiconductor laser elements, a p-type impurity such as Mg is doped to the p-side semiconductor layer of a nitride semiconductor laser element, but p-type impurities form deep-level traps, which cause light absorption to occur. For this reason, the higher the light intensity in the p-type impurity-containing layer, the larger the resulting absorption loss, which lowers efficiency such as slope efficiency. Accordingly, the present disclosure proposes a semiconductor laser element capable of reducing absorption losses and increasing efficiency.

In one embodiment, a semiconductor laser element includes: an n-side semiconductor layer formed of a nitride semiconductor; an active layer on or above the n-side semiconductor layer and formed of a nitride semiconductor; and a p-side semiconductor layer disposed on the active layer, formed of a nitride semiconductor and including an undoped first part disposed in contact with an upper face of the active layer and including at least one semiconductor layer, an electron barrier layer disposed in contact with an upper face of the first part, containing a p-type impurity, and having a band gap energy that is larger than a band gap energy of the first part, and a second part disposed in contact with an upper face of the electron barrier layer and including at least one p-type semiconductor layer containing a p-type impurity. At least a portion of the p-side semiconductor layer forms a ridge projecting upward and having an upper face and a lower end. The first part includes an undoped p-side composition graded layer in which a band gap energy increases towards the electron barrier layer, and an undoped p-side intermediate layer disposed on or above the undoped p-side composition graded layer. The lower end of the ridge is positioned at the undoped p-side intermediate layer.

In another embodiment, a semiconductor laser element includes: an n-side semiconductor layer formed of a nitride semiconductor; an active layer disposed on or above the n-side semiconductor layer and formed of a nitride semiconductor; and a p-side semiconductor layer disposed on the active layer, formed of a nitride semiconductor, and including an undoped first part disposed in contact with an upper face of the active layer and including at least one semiconductor layer, an electron barrier layer disposed in contact with an upper face of the first part, containing a p-type impurity, and having a band gap energy that is larger than a band gap energy of the first part, and a second part disposed in contact with the upper face of the electron barrier layer and including at least one p-type semiconductor layer containing a p-type impurity. At least a portion of the p-side semiconductor layer forms a ridge projecting upward and having an upper face and a lower end. The second part has a thickness that is smaller than a thickness of the first part. The lower end of the ridge is positioned at the first part.

In another embodiment, a method for manufacturing a semiconductor laser element includes: forming an n-side semiconductor layer on or above a substrate; forming an active layer on or above the n-side semiconductor layer; forming an undoped first part on an upper face of the active layer, the undoped first part including at least one semiconductor layer; forming an electron barrier layer on an upper face of the first part, the electron barrier layer being doped with a p-type impurity and having a band gap energy that is larger than a band gap energy of the first part; forming a second part on an upper face of the electron barrier layer, the second part including at least one p-type semiconductor layer doped with a p-type impurity; and forming a ridge projecting upward by partially removing a portion of the p-side semiconductor layer including a portion of the first part, a portion of the electron barrier layer, and a portion of the second part. The forming the undoped first part includes: forming an undoped p-side composition graded layer in which the band gap energy increases away from the active layer, and forming an undoped p-side intermediate layer above the p-side composition graded layer. In the forming the ridge, the p-side semiconductor layer is partially removed such that a lower end of the ridge is positioned at the p-side intermediate layer.

In another embodiment, a method for manufacturing a semiconductor laser element includes: forming an n-side semiconductor layer on or above a substrate; forming an active layer on or above the n-side semiconductor layer; forming an undoped first part on an upper face of the active layer, the undoped first part including at least one semiconductor layer; forming an electron barrier layer on an upper face of the first part, the electron barrier layer being doped with a p-type impurity and having a band gap energy that is larger than a band gap energy of the first part; forming a second part on an upper face of the electron barrier layer, the second part including at least one p-type semiconductor layer doped with a p-type impurity; and forming a ridge projecting upward by partially removing a portion of a p-side semiconductor layer including a portion of the first part, a portion of the electron barrier layer, and a portion of the second part. In the forming the second part, the second part is formed so as to have a thickness that is smaller than a thickness of the first part. In the forming the ridge, the p-side semiconductor layer is partially removed such that a lower end of the ridge is positioned at the first part.

According to certain embodiments, a semiconductor laser element can be provided that has reduced absorption losses and, therefore, increased efficiency.

DETAILED DESCRIPTION

Figure 1:
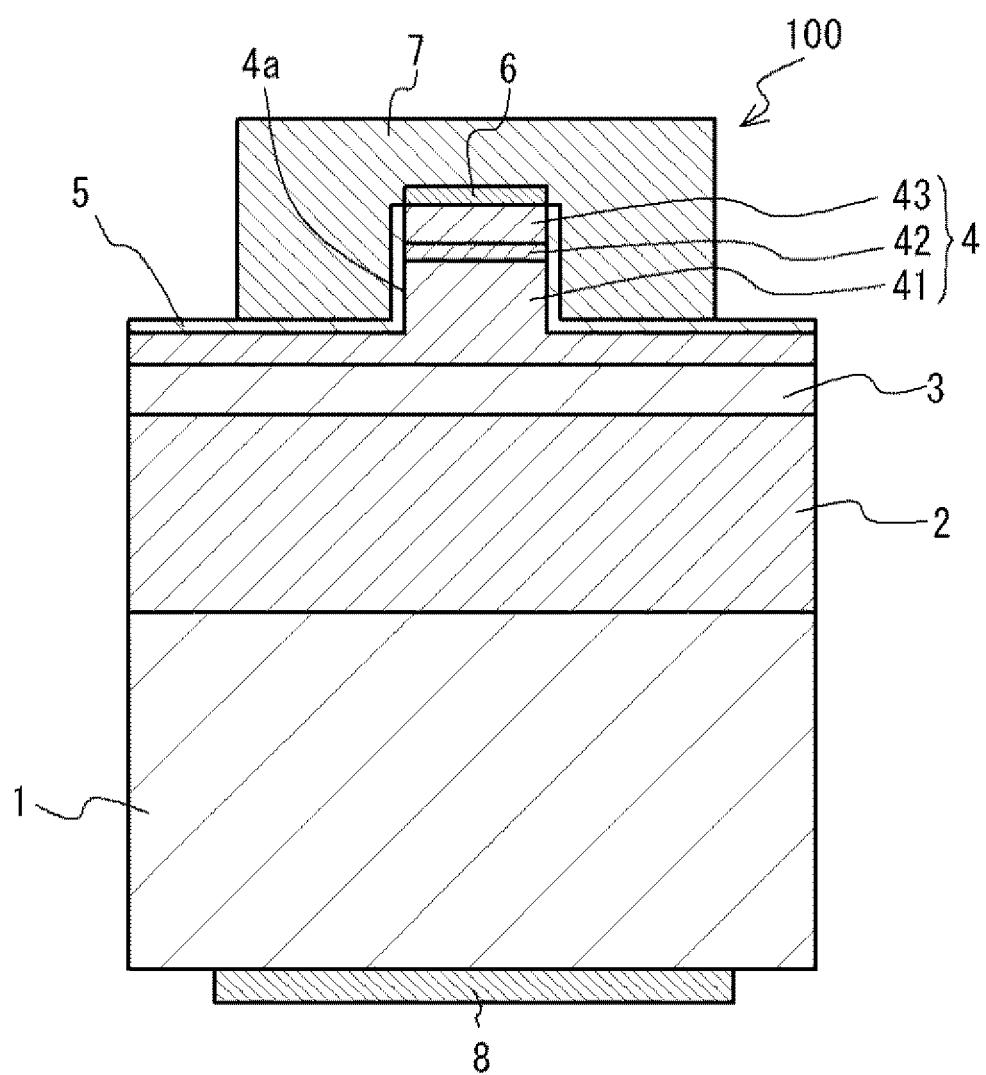
FIG. 1 is a schematic cross-sectional view of a semiconductor laser element according to one embodiment of the present invention.

Certain embodiments of the present invention will be explained below with reference to the drawings. The embodiments described below, however, are examples giving shape to the technical ideas of the present invention, and the prevent invention is not limited to the embodiments described below. In the explanation below, moreover, the same designations and reference numerals denote the same or similar members for which the detailed explanation will be omitted as appropriate.

Figure 4:
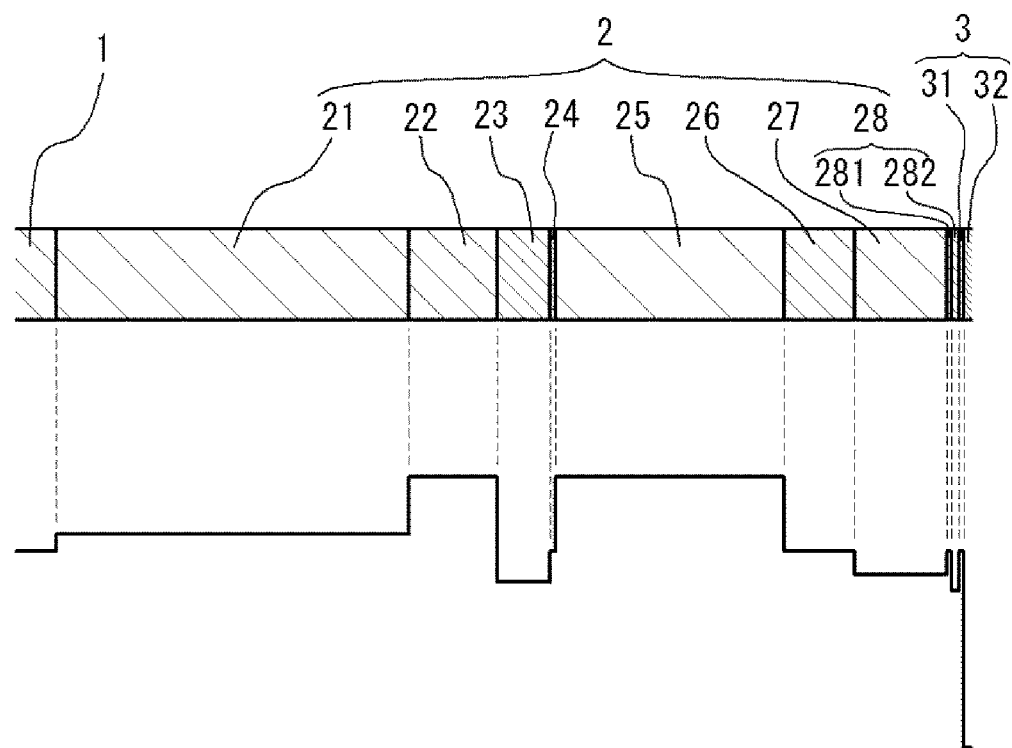
FIG. 4 is a schematic diagram of an example of the layer structure of the n-side semiconductor layer of the semiconductor laser element shown in FIG. 1.

FIG. 1 is a schematic cross-sectional view of a semiconductor laser element 100 according to one embodiment of the present invention, showing a cross section in the direction perpendicular to the resonator of the semiconductor laser element 100. FIGS. 2A to 2D are schematic diagrams of the layer structures of the p-side semiconductor layer 4, each showing a different example. FIGS. 2A to 2D schematically show the relative magnitudes of the band gap energy of a portion of the active layer 3 and each layer in the p-side semiconductor layer 4 of the semiconductor laser elements 100. In FIGS. 2A to 2D, a one-dot chain line indicates the position of the lower end of the ridge 4a. The lower end of the ridge 4a refers to the region between the lowermost sides of both lateral faces of the ridge 4a. FIG. 4 is a schematic diagram of an example of the layer structure of the n-side semiconductor layer 2.

As shown in FIG. 1, the semiconductor laser element 100 has an n-side semiconductor layer 2, an active layer 3, and a p-side semiconductor layer 4, each made of a nitride semiconductor and successively disposed in that order towards the top. A ridge 4a projecting upward is created in the p-side semiconductor layer 4. In the description herein, the direction from the n-side semiconductor layer 2 to the p-side semiconductor layer 4 is referred to as upward or towards the top, and the opposite direction is referred to as downward or towards the bottom.

The p-side semiconductor layer 4 has a first part 41, an electron barrier layer 42, and a second part 43. The first part 41 is disposed in contact with the upper face of the active layer 3 and has at least one semiconductor layer. The first part 41 is undoped. The electron barrier layer 42 is disposed in contact with the upper face of the first part 41. The electron barrier layer 42 has a larger band gap energy than the first part 41 and contains a p-type impurity. The second part 43 is disposed in contact with the upper face of the electron barrier layer. The second part 43 has at least one p-type semiconductor layer containing a p-type impurity. The lower end of the ridge 4a is positioned in the first part 41. In other words, the ridge 4a is made up of a portion of the first part 41, the electron barrier layer 42, and the second part 43. In the description herein, the term "undoped" refers to a layer or the like that is not intentionally doped. It is fair to say that a layer is undoped when the impurity concentration does not exceed the detection limit as a result of the analysis by secondary ion mass spectrometry (SIMS). Alternatively, the state in which the impurity concentration is under $1\times10^{17}/cm^3$ can be defined as undoped. For example, the first part 41 can be called undoped when a p-type or n-type impurity concentration is under the detection limit. However, because the first part 41 is in contact with the electron barrier layer 42, which has a high p-type impurity concentration, the p-type impurity might occasionally be detected when analyzed even if it were not intentionally doped with a p-type impurity. In this case, the p-type impurity concentration detected may be above $1\times10^{17}/cm^3$ because the p-type impurity is diffused into the first part 41 from the electron barrier layer 42, but the p-type impurity concentration detected is preferably under $1\times10^{18}/cm^3$. In this case, the p-type impurity concentration detected in the first part 41 may decrease away from the electron barrier layer 42. Moreover, when the first part 41 or the like is formed to be undoped, it might turn out to contain an unintended impurity such as H, C, or the like. Even in this case, it can still be called undoped. In the description herein, the film thickness or thickness of a certain layer or part refers to the shortest distance from the lowermost face to the uppermost face of the layer or part. In the case in which the lowermost face and/or the uppermost face has indentations and/or projections such as V-pits, the shortest distance between the flat parts of the uppermost and lowermost faces where indentations or projections are absent can be considered as the film thickness or thickness of the layer or part.

The semiconductor laser element 100 has the structures (1) to (3) described below. (1) The first part 41 has an undoped p-side composition graded layer 411 in which the band gap energy increases towards the top and an undoped p-side intermediate layer 412 disposed above the p-side composition graded layer 411. The lower end of the ridge is positioned in the p-side intermediate layer 412. (2) The thickness of the second part 43 is smaller than the thickness of the first part 41, and the lower end of the ridge 4a is positioned in the first part 41. (3) The thickness of the first part 41 is at least 400 nm, and the lower end of the ridge 4a is positioned in the first part 41. The semiconductor laser element 100 may satisfy any one of these structures (1) to (3), or simultaneously satisfy two or more.

Figure 2A:
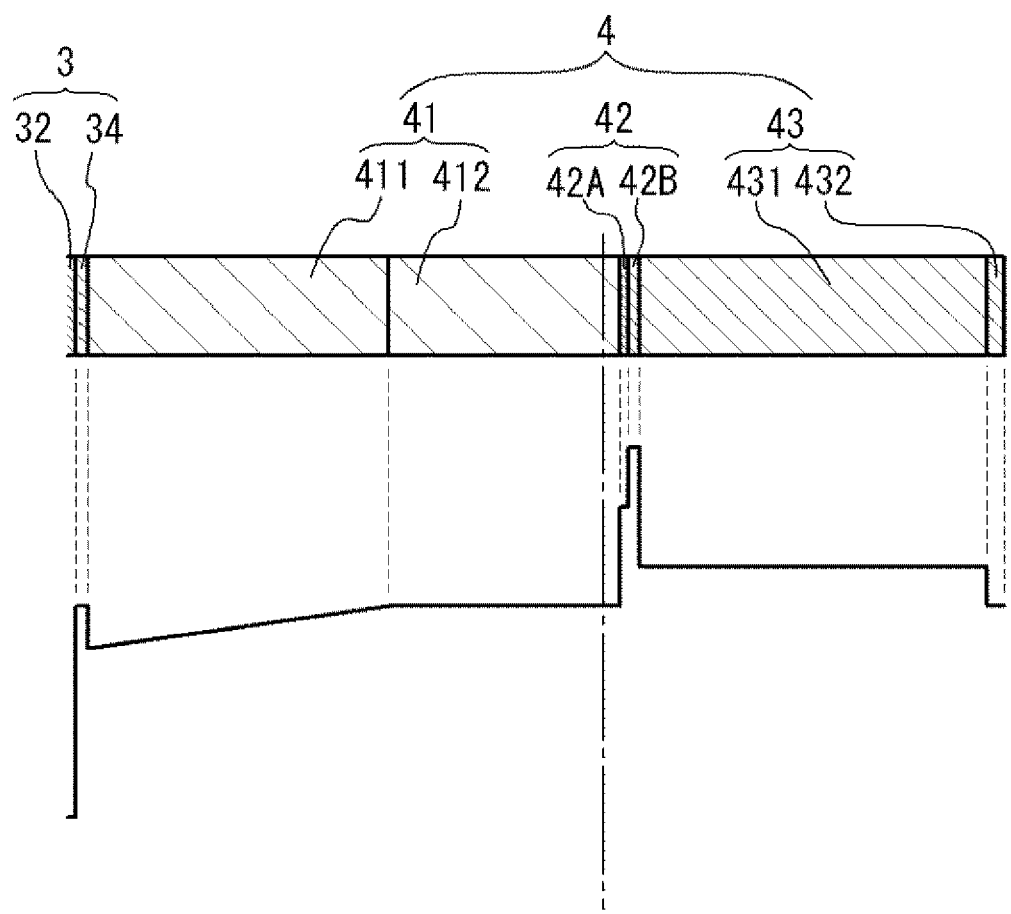
FIG. 2A is a schematic diagram of an example of the layer structure of the p-side semiconductor layer of the semiconductor laser element shown in FIG. 1.

The structure (1) will be described first. As shown in FIG. 2A, the p-side composition graded layer 411 is a layer in which the band gap energy increases towards the top. Having such a layer can enhance optical confinement to the active layer 3. The p-side intermediate layer 412 is a different layer from the p-side composition graded layer 411. Disposing not only the p-side composition graded layer 411, but also the p-side intermediate layer 412 can provide a relatively larger thickness to the first part 41. This can keep the peak light intensity at a distance from the electron barrier layer 42 and the second part 43 that contain p-type impurities. These features can lower the light intensity in the second part 43, thereby reducing optical absorption losses. This can consequently increase the efficiency of the semiconductor laser element 100. An example of the efficiency of the semiconductor laser element 100 is slope efficiency, which is represented by a slope in the current-light output graph at the threshold current value or higher.

The lower end of the ridge 4a is positioned deeper than the electron barrier layer 42, i.e., in the p-side intermediate layer 412. This can reduce the distance between the lower end of the ridge 4a and the active layer 3 even when the first part 41 is relatively thick. Accordingly, optical confinement in the transverse direction can be enhanced as compared to the case in which the lower end of the ridge 4a is positioned higher than the first part 41. Weak optical confinement makes the horizontal transverse mode of the semiconductor laser element 100 unstable, which might allow kinks to occur in the I-L characteristics that show the relationship between current and light output. Forming a ridge 4a with the lower end in the p-side intermediate layer 412 can enhance optical confinement in the transverse direction and can stabilize the horizontal transverse mode, thereby reducing the likelihood of causing kinks in the I-L characteristics to occur. Moreover, the lower end of the ridge 4a might allow for electrical leakage attributable to etching damage or the like incurred during the formation of the ridge 4a. Thus, the lower end of the ridge 4a is preferably positioned not too close to the active layer 3. The lower end of the ridge 4a is preferably positioned in the p-side intermediate layer 412 rather than the p-side composition graded layer 411.

The structure (2) will be described next. Because the first part 41 has a relatively large thickness, similar to (1), the peak light intensity can be kept at a distance from the p-type impurity-containing layers, and losses attributable to free carrier absorption in the p-type impurity-containing layers can be reduced. Thus, the efficiency of the semiconductor laser element 100, such as slope efficiency, can be improved. In addition, the second part 43 having a small thickness can reduce the drive voltage, thereby increasing the efficiency of the semiconductor laser element 100. Providing a thin p-type impurity-containing part can reduce the voltage because in a nitride semiconductor, p-type impurities such as Mg have a lower activation rate than n-type impurities, and p-type impurity-containing layers have a relatively high resistance. Although undoped, the first part 41 is positioned between the electron barrier layer 42 and the active layer 3. It thus tends to show the n-type conductivity rather than complete insulation properties attributable to factors such as an electron overflow. It is considered that reducing the thickness of the relatively high resistant p-type impurity-containing second part 43 can lower the drive voltage and achieve the effect of attenuating a drive voltage increase that can result from increasing the thickness of the undoped first part 41. This effect was confirmed by the Test Result 2 for Examples 1 to 3 described below. Similar to (1), the lower end of the ridge 4a is preferably positioned in the first part 41 because the first part 41 has a relatively large thickness, which can enhance optical confinement in the transverse direction.

Structure (3) will be described next. The first part 41 having a relatively large thickness, i.e., at least 400 nm, can reduce losses in the p-type impurity-containing layers, thereby increasing the efficiency as in the cases of (1) and (2). Similar to (1) and (2), positioning the lower end of the ridge 41 in the first part 41 can enhance optical confinement in the transverse direction.

With regard to the structure of the first part 41, several patterns were assumed, and equivalent refractive index simulations were performed. In the simulations, the refractive index of each layer was calculated based on the composition ratio of the nitride semiconductor constituting the layer by using the formula disclosed by M. J. Bergmann, et al., Journal of Applied Physics, Vol. 84 (1998), pp. 1196-1203. For Calculation Example 1, the structure having only a p-side composition graded layer 411 of 260 nm in thickness as the first part 41 was used. For Calculation Examples 2 to 5, the structure having a p-side composition graded layer 411 and a p-side intermediate layer 412 as the first part 41 was used. The film thicknesses of the p-side intermediate layer 412 in Calculation Examples 2 to 5 were 50 nm, 100 nm, 200 nm, and 400 nm, respectively. In other words, the thicknesses of the first part 41 in Calculation Examples 1 to 5 were 260 nm, 310 nm, 360 nm, 460 nm, and 660 nm, respectively. The layer structures of those other than the first part 41 were generally the same as those of the semiconductor laser element 100 of Example 1 described below, with slight differences in detail, including the second n-side optical guide layer 27, which was a composition graded layer changing from GaN to $In_{0.05}Ga_{0.95}N$. The layer structures of those other than the first part 41 were the same among Calculation Examples 1 to 3, and those in Calculation Examples 4 and 5 were the same as those in Calculation Examples 1 to 3 except such that the thickness of the first n-side optical guide layer 26 was reduced to two thirds. The thickness of the first n-side optical guide layer 26 in Calculation Examples 4 and 5 was reduced in order to compensate for a peak electric field intensity deviation from the active layer 3 attributable to the thick first part 41.

Figure 7:
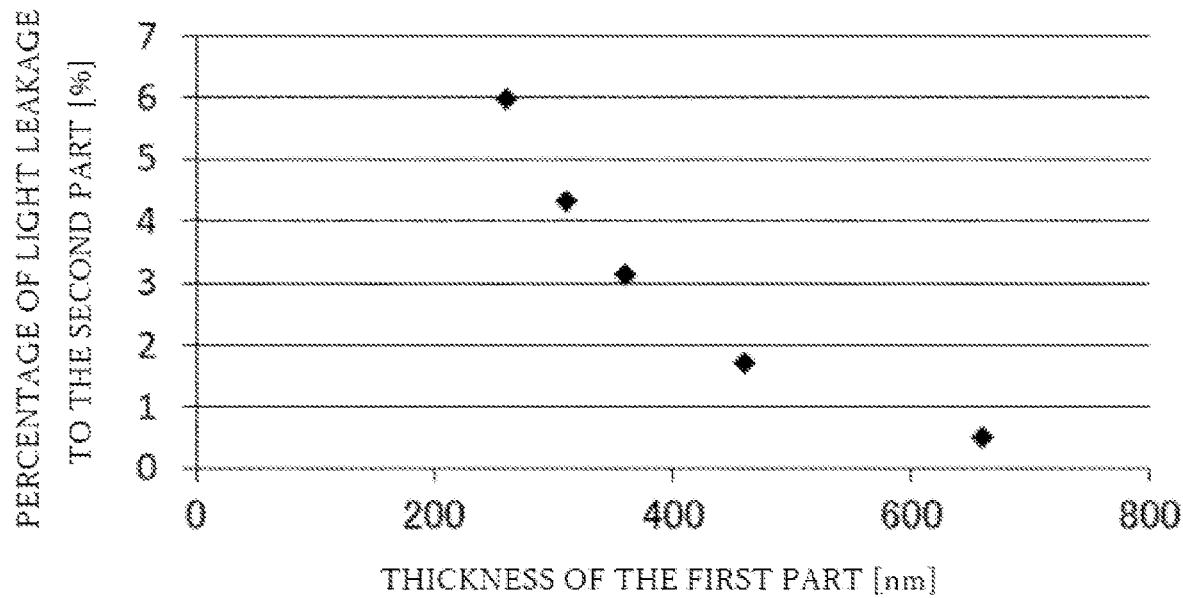
FIG. 7 is a graph showing the relationship between the thickness of the first part and the leakage of light to the second part in Calculation Examples 1 to 5.

FIG. 7 shows the relationship between the thickness of the first part 41 and the percentage of light leakage to the second part 43 with respect to Calculation Examples 1 to 5. As shown in FIG. 7, the larger the thickness of the first part 41, the smaller the light leakage to the second part 43 resulted with the degree of decrease moderating at around the thickness of 400 nm. From this, the thickness of the first part 41 is preferably at least 400 nm. This can minimize the light leakage to the second part 43, for example, under 3%.

Semiconductor Laser Element 100

As shown in FIG. 1, the semiconductor laser element 100 has a substrate 1, and disposed on the substrate, an n-side semiconductor layer 2, an active layer 3, and a p-side semiconductor layer 4. The semiconductor laser element 100 is an edge emitting laser element having a light emitting facet and a light reflecting facet that cross the principal faces of the semiconductor layers such as the active layer 3. A ridge 4a is created in the upper portion of the p-side semiconductor layer 4. The ridge 4a has a mesa structure. The top view shape of the ridge 4a is a rectangle that is longer in the direction linking the light emitting facet and the light reflecting facet, for example, a rectangle having short sides paralleling the light reflecting facet and long sides perpendicular to the light reflecting facet. The part of the active layer 3 located immediately under the ridge 4a and in the vicinity thereof is the optical waveguide region. An insulation film 5 can be disposed on the lateral faces of the ridge 4a and the surface of the p-side semiconductor layer 4 that continues from the lateral faces of the ridge 4a. The substrate 1 is made of an n-type semiconductor, for example, and an n-electrode 8 is disposed on the lower face. Moreover, a p-electrode 6 is disposed in contact with the upper face of the ridge 4a, and a p-side pad electrode 7 is further disposed thereon.

The semiconductor laser element 100 can have a structure to emit laser light in the long wavelength range. The semiconductor laser element 100 can emit laser light in the green wavelength range, for example, laser light having a wavelength of at least 530 nm. In other words, it can emit laser light having a peak wavelength of 530 nm or higher. As the emission wavelength increases from the blue wavelength range to the green wavelength range, leakage of light from the optical guide layer increases due to wavelength dependent refractive index variation, i.e, dispersion. This consequently increases the threshold current to increase the current density during laser emission. The higher the current density, the larger the effective transition interval becomes due to screening of localized energy levels and band filling effect, which can shift the emission wavelength to the short-wavelength side. Disposing a p-side composition graded layer 411 can reduce the laser emission threshold current density, thereby restraining the wavelength from shifting to the short-wavelength side as discussed below. In the case of a semiconductor laser element emitting light in the green wavelength range, there hardly is a refractive index difference between the clad layer and the active layer due to wavelength dependent refractive index variation, i.e., dispersion. Thus, it still has a higher threshold current density and lower slope efficiency than a semiconductor laser element emitting light in the blue wavelength range. Accordingly, a semiconductor laser element in the green wavelength range employing the features of this embodiment is expected to achieve a greater efficiency improving effect resulting from reduced optical absorption losses in the p-type semiconductor layers. Optical absorption losses in the p-type semiconductor layers can occur regardless of the wavelength of the laser light emitted by the semiconductor laser element 100. Accordingly, the wavelength of the laser light emitted by the semiconductor laser element 100 is not limited to the green wavelength region; for example, it may be in the blue wavelength region.

Substrate 1

For the substrate 1, a nitride semiconductor substrate composed of GaN, for example, can be used. Examples of the n-side semiconductor layer 2, the active layer 3, and the p-side semiconductor layer 4 to be grown on the substrate 1 include semiconductors grown in substantially the c-axis direction. For example, by using a GaN substrate having a +c plane ((0001) plane) as a principal plane, each semiconductor layer can be grown on the +c plane. Having a +c plane as a principal plane herein may include those that are off by about ±1 degree. Employing a substrate having a +c plane as a principal plane provides the benefit of higher production efficiency.

N-Side Semiconductor Layer 2

The n-side semiconductor layer 2 can have a multilayer structure composed of nitride semiconductors, such as GaN, InGaN, AlGaN, or the like. The n-side semiconductor layer 2 includes at least one n-type semiconductor layer. Examples of n-type semiconductor layers include layers composed of a nitride semiconductor containing an n-type impurity, such as Si, Ge, or the like. The n-side semiconductor layer 2 can have an n-side clad layer and an n-side optical guide layer, and may include additional layers. The n-side clad layer has a larger band gap energy than the n-side optical guide layer. Although not as much as a p-type impurity, an n-type impurity is also a factor for optical absorption. Thus, the n-side optical guide layer is preferably undoped, or has a lower n-type impurity concentration than that in the n-side clad layer.

FIG. 4 shows an example of the layer structure of the n-side semiconductor layer 2. The n-side semiconductor layer 2 shown in FIG. 4 has, successively from the substrate 1 side, an underlayer 21, a first n-side clad layer 22, a crack suppressing layer 23, an intermediate layer 24, a second n-side clad layer 25, a first n-side optical guide layer 26, a second n-side optical guide layer 27, and a hole blocking layer 28. The hole blocking layer 28 has a first hole blocking layer 281 and a second hole blocking layer 282.

An n-type impurity is doped to the layers from the underlayer 21 to the first n-side optical guide layer 26. The underlayer 21, for example, is an n-type AlGaN layer. The first n-side clad layer 22, for example, is an n-type impurity-doped layer having a larger band gap energy than the underlayer 21. The crack suppressing layer 23, for example, is composed of InGaN, and has a smaller band gap energy than a well layer in the active layer 3. Disposing a crack suppressing layer 23 can reduce the probability of the occurrence of cracks. The intermediate layer 24 has a lattice constant between those of the crack suppressing layer 23 and the second n-side clad layer 25, and is composed of GaN, for example. In the case in which the crack suppressing layer 23 is an InGaN layer, it is preferable to grow a GaN intermediate layer 24 before allowing the second n-side clad layer 25 to grow. If the second n-side clad layer 25 were grown in contact with the upper face of the crack suppressing layer 23, a portion of the crack suppressing layer 23 might decompose to occasionally affect even the growth of the active layer 3. Disposing the intermediate layer 24 can reduce the probability of the occurrence of such decomposition. The intermediate layer 24 has a thickness that is smaller than that of the crack suppressing layer 23, for example. The second n-side clad layer 25 is a layer having a larger band gap energy than the underlayer 21, for example, and may be made of the same material as the first n-side clad layer 22. The first n-side clad layer 22 and the second n-side clad layer 25 are made of, for example, AlGaN. One or both of the first n-side clad layer 22 and the second n-side clad layer 25 may have the largest band gap energy in the n-side semiconductor layer 2. The composition and/or the n-type impurity concentration of the first n-side clad layer 22 may be the same as those of the second n-side clad layer 25. There may be a single n-side clad layer, and in this case the crack suppressing layer may be absent, or may be disposed on or under the n-side clad layer.

The first n-side optical guide layer 26 has a smaller band gap energy and a lower n-type impurity concentration than the first n-side clad layer 22 and the second n-side clad layer 25. The first n-side optical guide layer 26 is composed of GaN, for example. The band gap energy of the second n-side optical guide layer 27 is larger than that of a well layer in the active layer 3, but smaller than that of the first n-side optical guide layer 26. Because the second n-side optical guide layer 27 is positioned closer to the active layer 3 than is the first n-side optical guide layer 26, the second n-side optical guide layer 27 preferably has a lower n-type impurity concentration than that of the first n-side optical guide layer 26 for optical absorption loss reduction purposes. The second n-side optical guide layer 27 is composed of undoped InGaN, for example.

The second n-side optical guide layer 27 may be a composition graded layer in which the band gap energy becomes smaller as the distance to the active layer 3 decreases. In the case of disposing a composition graded layer as the n-side optical guide layer, the layer's composition is changed stepwise such that the refractive index becomes higher as the distance to the active layer 3 decreases. This can continuously form an optical waveguide barrier in the n-side composition graded layer, thereby enhancing optical confinement to the active layer 3. For the criteria used in determining the magnitudes of band gap energy and impurity concentration of the composition graded layer relative to the other layers, the average value for the composition graded layer can be used. An average value of a composition graded layer refers to the value obtained by multiplying the band gap energy or the like of each sublayer in the composition graded layer by the thickness, followed by dividing the sum of the products by the total film thickness. In the case of disposing a composition graded layer in the n-side semiconductor layer 2 in which the lattice constant increases as the distance to the active layer 3 decreases, it is preferable to dope an n-type impurity to the composition graded layer. The composition graded layer, in other words, is made up of multiple sublayers each having a slightly different composition. For this reason, in the composition graded layer, it is difficult to avoid the occurrence of fixed charges even if the rate of composition change is reduced. Because the doping of an n-type impurity can screen fixed charges, the degree of voltage increase attributable to fixed charges can be lowered.

An n-type impurity is preferably contained in at least one portion of the hole blocking layer 28. This can increase the hole blocking efficiency. For example, the first hole blocking layer 281 is made of GaN, and the second hole blocking layer 282 is made of InGaN.

Active Layer 3

The active layer 3 can be have a multilayer structure composed of nitride semiconductor layers, such as GaN, InGaN, and the like. The active layer 3 has a single quantum well structure or multiple quantum well structure. It is considered that a multiple quantum well structure can more easily achieve sufficient gain than a single quantum well structure. In the case in which the active layer 3 has a multiple quantum well structure, it has multiple well layers, and intermediate barrier layers interposed between well layers. For example, the active layer 3 includes, successively from the n-side semiconductor layer 2 side, a well layer, an intermediate barrier layer, and a well layer. An n-side barrier layer 31 may be disposed between the well layer closest to the n-side semiconductor layer 2 and the n-side semiconductor layer 2. The n-side barrier layer 31 may be allowed to function as a part of the hole blocking layer 28. The hole blocking layer 28 or the n-side optical guide layer (second n-side optical guide layer 27) may be allowed to function as a barrier layer while omitting the n-side barrier layer 31. Similarly, a p-side barrier layer may be disposed between the well layer closest to the p-side semiconductor layer 4 and the p-side semiconductor layer 4. In the case in which no p-side barrier layer is provided or the p-side barrier layer has a small thickness, a portion of the p-side semiconductor layer 4 may be allowed to function as a p-side barrier layer. In the case of disposing a p-side barrier layer in the active layer 3, the film thickness of the p-side barrier layer can be 5 nm at most, for example. In other words, the shortest distance between the p-side semiconductor layer 4 and a well layer in the active layer 3 is 5 nm at most, for example. As described above, moreover, because the doping of a p-type impurity increases optical absorption losses, the active layer 3 is preferably formed without doping any p-type impurity. Each layer in the active layer 3, for example, is an undoped layer.

In the case of a semiconductor laser element having an emission wavelength of at least 530 nm, the Indium composition ratio x in an $In_xGa_{1-x}N$ well layer can slightly vary depending on the layer structures of those other than the active layer 3, but is at least 0.25, for example. The upper limit for the Indium composition ratio x in a well layer, for example, is 0.50 at most. At this time, the emission wavelength of the semiconductor laser element is believed to be about 600 nm at most.

P-Side Semiconductor Layer 4

The p-side semiconductor layer 4 can have a multilayer structure composed of nitride semiconductors, such as GaN, InGaN, AlGaN, or the like. The p-side semiconductor layer 4 can include a p-side clad layer and a p-side optical guide layer, and may include additional layers. In the case of disposing a transparent conductive film as a p-electrode 6, this can be allowed to function as a clad layer. Thus, a clad layer does not have to be disposed in the p-side semiconductor layer 4.

The p-side semiconductor layer 4 includes at least one p-type semiconductor layer. Examples of p-type semiconductor layers include a nitride semiconductor layer containing a p-type impurity such as Mg or the like. Because the activation rates of p-type impurities are lower than those of n-type impurities such as Si, the free carrier absorption loss in the p-type semiconductor layer is increased by p-type impurities. The larger the absorption loss, the lower the slope efficiency of the semiconductor laser element 100 results. An internal loss $\alpha_i$ generally includes free carrier absorption loss $\alpha_{fc}$. Assuming that $\alpha_{int}$ represents the internal loss other than free carrier absorption loss $\alpha_{fc}$, the threshold modal gain required for laser emission is represented by the model formula below that depends on free carrier absorption loss. Here, $\alpha_{fc}$, $\alpha_i$, and $\alpha_m$ represent free carrier absorption loss, average internal loss, and mirror loss, respectively. As a matter of convenience, the average is used without taking modal distribution into consideration. In the formula, $\Gamma$ represents the optical confinement factor for the active region, and $g_{th}$ represents the threshold gain for laser emission.

$\Gamma g_{th} = \alpha_{fc} + \alpha_{int} + \alpha_m$

The free carrier absorption loss here includes the losses in layers other than the active layer 3. In the p-type semiconductor layer, for example, the free carrier absorption loss can be approximated by the product of the p-type impurity concentration n, the factor $\sigma_{fc}$ that reflects the free carrier absorption cross-sectional area, and the average light leakage to the p-type semiconductor layer $\Gamma_p$. In other words, for a certain impurity concentration in a p-type semiconductor layer, the free carrier absorption loss $\alpha_{fc}$ increases as the light leakage to the p-type semiconductor layer increases. Similarly, for a certain light leakage to the p-type semiconductor layer, the free carrier absorption loss $\alpha_{fc}$ increases as the impurity concentration in the p-type semiconductor layer increases. Because a low p-type impurity concentration raises a concern of considerably increasing the drive voltage, it is particularly effective to reduce light leakage to a layer of high p-type impurity concentration for free carrier absorption loss $\alpha_{fc}$ reduction purposes.

$\alpha_{fc} = n \times \sigma_{fc} \times \Gamma_p$

It can be understood from the above formulas that an increase in light leakage to the p-type clad layer increases the free carrier absorption loss to thereby increase the threshold gain $g_{th}$. During laser emission, a steady state of $g = g_{th}$ is maintained in the resonator. In such a steady state, the modal gain depends monotonically on the carrier density. Thus, the carrier density at the laser emission threshold current or higher is maintained at the threshold carrier density $N_{th}$. The higher the injected carrier density, the more localized energy level screening results and the larger the substantial band gap becomes, which readily shifts the laser emission wavelength to the short-wavelength side. Reducing the free carrier absorption loss $\alpha_{fc}$, thereby reaching the threshold gain $g_{th}$ at a lower current can reduce both the threshold current density $j_{th}$ and the threshold carrier density $N_{th}$. This can reduce the injected carrier density, thereby reducing localized level screening and allowing for laser emission at a longer wavelength. Accordingly, it is preferable from this perspective as well to reduce the free carrier absorption loss in a semiconductor laser element 100 capable of emitting laser light of a long wavelength such as 530 nm or higher. Even in the case of a semiconductor laser element on the shorter wavelength side, this has the benefit of achieving a laser light source having a low threshold current.

Here, screening of localized levels being reduced has been explained, but band filling effect can similarly be reduced. Band filling effect, which expands the effective transition interval as a quasi-Fermi level is separated from the band end by current injection, can also cause a shift to shorter wavelengths. This can also be reduced when the threshold carrier density is lowered by reducing the free carrier absorption loss $\alpha_{fc}$.

First Part 41

The first part 41 is a portion of the p-side semiconductor layer 4 that connects the active layer 3 and the p-type impurity-containing layers. The first part 41 is the portion that does not include a p-type semiconductor layer. A p-type impurity-containing layer may be included in a portion of the first part 41 so long as the layer has a film thickness and p-type impurity concentration that would not affect the free carrier absorption loss. In the case of doping with Mg required for p-type conversion, the p-type impurity of at least about $1 \times 10^{18}/cm^3$ is required, and this highly likely increases the free carrier absorption loss. Accordingly, the first part 41 is preferably a part that does not include a p-type semiconductor layer. The p-type impurity concentration throughout the first part 41 is preferably low enough to be undetectable in a SIMS analysis or the like. For example, the first part 41 is formed during manufacturing without intentionally doping a p-type impurity in its entirety. As described above, the larger the thickness of the first part 41, the more reduction in the light leakage to the second part 43 results. Thus, the thickness of the first part 41 is preferably at least 400 nm. The upper limit value for the thickness of the first part 41 can be set to one that does not interfere with the supply of holes from the second part 43. As shown by the Test Result 3 described below, the larger the thickness of the first part 41, the more electron overflow results. From this perspective, the thickness of the first part 41 is preferably small. The thickness of the first part 41 can be set, for example, to 660 nm at most. Because of the band gap difference from the electron barrier layer 42, the first part 41 can reduce the probability of the occurrence of an electron overflow. Accordingly, the first part 41 preferably has a layer having a smaller band gap energy than the electron barrier layer 42 as a layer in contact with the electron barrier layer 42.

In the case of making the first part 41 a low-concentration doped part rather than an undoped part, the p-type impurity concentration throughout the first part 41 is preferably lower than the p-type impurity concentration of the electron barrier layer 42, more preferably lower than those of both the electron barrier layer 42 and the second part 43. An example of the n-type impurity concentration of the first part 41 is $2 \times 10^{18}/cm^3$. Preferably, the n-type impurity concentration of the first part 41 is low enough to be undetectable by a SIMS analysis (i.e., a background level). In other word, the first part 41 preferably contains substantially no n-type impurity.

P-Side Composition Graded Layer 411 and P-Side Intermediate Layer 412

The first part 41, as shown in FIG. 2A, can have a p-side composition graded layer 411 and a p-side intermediate layer 412. The p-side intermediate layer 412 is disposed above the p-side composition graded layer 411. The p-side intermediate layer 412 may be disposed in contact with the upper face of the p-side composition graded layer 411, or in contact with the lower face of the electron barrier layer 42. Although the structure of the first part 41 is not limited to one having both the p-side composition graded layer 411 and the p-side intermediate layer 412, as described above, having a p-side composition graded layer 411 can enhance optical confinement to the active layer 3, and having a p-side intermediate layer 412 can make the thickness of the first part 41 even larger. Enhancing optical confinement to the active layer 3 by disposing the p-side composition graded layer 411 can reduce the laser emission threshold current density. This can reduce screening of localized energy levels to restrain the emission wavelength from shifting to short wavelengths caused by an increase in the injected current. This thus is beneficial in making the emission wavelength longer.

The p-side composition graded layer 411 is a layer in which the band gap energy increases towards the top. The p-side composition graded layer 411 has an upper face and a lower face, and the band gap energy increases from the lower face to the upper face. The band gap energy on the lower face side is smaller than on the upper face side. Although shown as a slope in FIG. 2A, as described below, the p-side composition graded layer 411 is a collection of multiple sublayers that are different in composition. Thus, it can be said that the band gap energy in the p-side composition graded layer 411 increases stepwise from the lower face to the upper face. An n-side composition graded layer that is paired with the p-side composition graded layer 411 may be disposed in the n-side semiconductor layer 2. An example of such an n-side composition graded layer is a layer in which the band gap energy decreases towards the active layer 3. For example, the p-side composition graded layer 411 and the n-side composition graded layer are symmetrically formed while interposing the active layer 3. Disposing composition graded layers on both sides of the active layer 3 in this manner can confine light to the active layer 3 from both sides in a well-balanced manner. For the purpose of enhancing the light confinement effect of the p-side composition graded layer 411, the p-side composition graded layer 411 is preferably disposed near the active layer 3. Accordingly, the p-side composition graded layer 411 is preferably disposed in contact with the active layer 3. The shortest distance between the p-side composition graded layer 411 and the well layer 32 in the active layer 3 is preferably 5 nm at most.

The p-side composition graded layer 411, for example, functions as a p-side optical guide layer. The film thickness of the p-side composition graded layer 411 is larger than the film thickness of the well layer 32, and in the case in which the p-side barrier layer 34 is present, is larger than the film thickness of the p-side barrier layer 34. For the purpose of enhancing the light confinement effect, the film thickness of the p-side composition graded layer 411 is preferably at least 200 nm. The film thickness of the p-side composition graded layer 411 can be set to 500 nm at most, preferably 350 nm at most, more preferably 300 nm at most. The band gap energy at the lower end of the p-side composition graded layer 411, in the case of disposing a p-side barrier layer 34, is preferably smaller than the band gap energy of the p-side barrier layer 34. The band gap energy at the upper end of the p-side composition graded layer 411 may be equal to or larger than the band gap energy of the p-side barrier layer 34. The p-side composition graded layer 411 preferably has the structure such that the refractive index monotonically decreases, and the band gap energy monotonically increases, from the active layer 3 side to the electron barrier layer 42 side in order to reduce an electron overflow while drawing light to the active layer 3.

Figure 5:
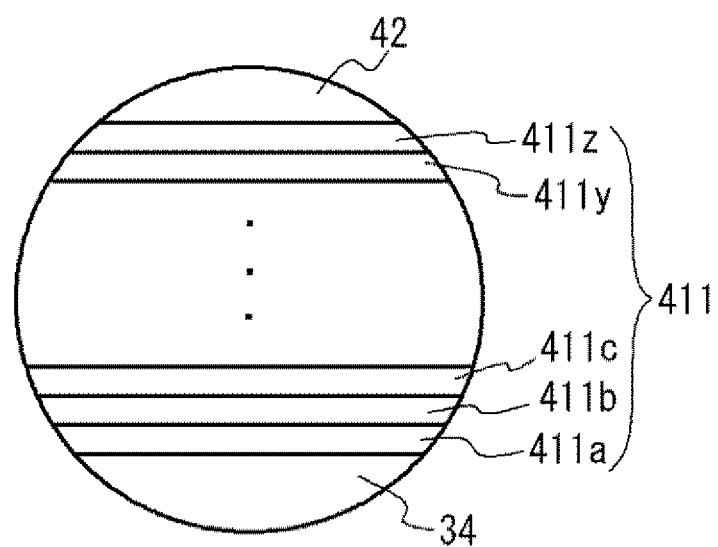
FIG. 5 is a partially enlarged view of the p-side composition graded layer and the vicinity in the semiconductor laser element shown in FIG. 1.

The p-side composition graded layer 411, as shown in FIG. 5, can be described as being made up of a plurality of sublayers 411a, 411b, 411c, 411y, and 411z each having a different composition from one another. FIG. 5 is a partially enlarged view of the p-side composition graded layer 411 and the vicinity, and a number of sublayers other than those explicitly shown are present between the sublayers 411c and 411y. In the case of forming the p-side composition graded layer 411 with InGaN or GaN, the lowermost sublayer 411a of the p-side composition graded layer 411 is made of $In_aGa_{1-a}N$ (0<a<1), and the uppermost sublayer 411z of the p-side composition graded layer 411 is made of $In_zGa_{1-z}N$ (0≤z<a). The upper limit value of the Indium composition ratio a is, for example, 0.25. Considering the reduction of crystallinity degradation, the Indium composition ratio a is preferably 0.1 at most. Moreover, the lattice constant difference between two adjacent sublayers is preferably small. This can reduce distortion. For this purpose, the p-side composition graded layer 411 is preferably formed by gradually changing the composition of sublayers in small thickness. Specifically, the p-side composition graded layer 411 preferably has an Indium composition ratio that decreases per film thickness of 25 nm at most from the lower face to the upper face. In other words, the film thickness of each of the sublayers 411a, 411b, 411c, 411y, and 411z is preferably 25 nm at most. The film thickness of each of the sublayers 411a, 411b, 411c, 411y, and 411z is more preferably 20 nm at most. The lower limit value of the film thickness of each of the sublayers 411a, 411b, 411c, 411y, and 411z is, for example, about one monoatomic layer (about 0.25 nm). The Indium composition ratio difference between two adjacent sublayers (e.g., the sublayer 411a and the sublayer 411b) is preferably 0.005 at most, more preferably 0.001 at most. The lower limit value is, for example, about 0.00007.

Such a range is preferably satisfied throughout the p-side composition graded layer 411. In other words, all sublayers preferably satisfy such a range. In a p-side composition graded layer 411 of 260 nm in film thickness, for example, when the lowermost sublayer 411a is $In_{0.05}Ga_{0.95}N$ and the uppermost sublayer 411z is GaN, the sublayers are grown under the manufacturing conditions that gradually change the composition in 120 steps. The number of composition changes made in the p-side composition graded layer 411 is preferably at least 90 times. The composition change rate (i.e., the composition difference between two adjacent sublayers) in the p-side composition graded layer 411 may remain constant or vary across the entire p-side composition graded layer 411. The composition change rate in the p-side composition graded layer 411 is preferably 0.001 at most across the entire layer. In the case of disposing an n-side composition graded layer, ranges for the composition, composition change rate, and film thickness similar to the preferable ranges for the p-side composition graded layer 411 can be employed.

It is preferable not to position the lower end of the ridge 4a in the p-side composition graded layer 411. If the lower edge of the ridge 4a is positioned in the p-side composition graded layer 411, the effective refractive index difference between inside and outside of the ridge 4a would vary considerably depending on the depth. The degree of such variation in the effective reactive index difference between inside and outside of the ridge 4a can be reduced by positioning the lower edge of the ridge 4a in a single composition layer. Accordingly, in the case of disposing a p-side composition graded layer 411, it is preferable to dispose a single composition layer for the purpose of positioning the lower edge 4a of the ridge. The single composition layer preferably has a thickness larger than the depth variation of the ridge 4a resulting from forming the ridge 4a. In this manner, even when the depth of the ridge 4a varies, the lower end of the ridge 4a can be positioned in the single composition layer, thereby reducing the variation in the effective refractive index difference between inside and outside of the ridge 4a. The film thickness of such a single composition layer for positioning the lower edge of the ridge 4a is preferably larger than a sublayer of the composition graded sublayer, and can be larger than 25 nm, for example. The film thickness of the single composition layer can be set to, for example, 600 nm at most. A single composition layer refers to a layer formed by not intentionally changing the composition.

Figure 2B:
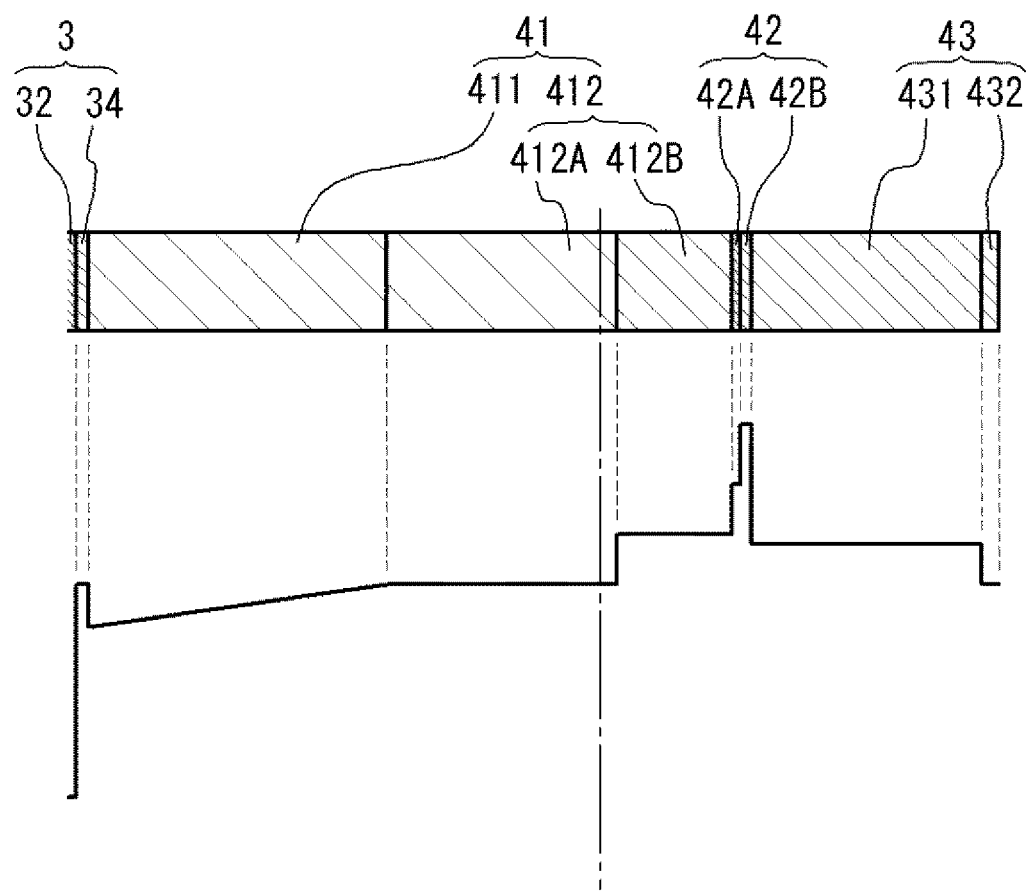
FIG. 2B is a schematic diagram of another example of the layer structure of the p-side semiconductor layer of the semiconductor laser element shown in FIG. 1.

The p-side intermediate layer 412 may be such a single composition layer, or may have a multilayer structure. In the case in which the p-side intermediate layer 412 has a multilayer structure, at least the layer in which the lower end of the ridge 4a will be positioned among the layers making up the p-side intermediate layer 412 can be formed as a single composition layer. In the case in which the p-side intermediate layer 412 has a multilayer structure, as shown in FIG. 2B, the p-side intermediate layer 412 can have a first layer 412A and a second layer 412B. The first layer 412A has a band gap energy larger than the average band gap energy of the p-side composition graded layer 411, but smaller than the band gap energy of the electron barrier layer 42. The second layer 412B has a band gap energy larger than the band gap energy of the first layer 412A, but smaller than the band gap energy of the electron barrier layer 42. The first layer 412A and the second layer 412B are undoped. The refractive indices of these layers can be set in descending order with the average refractive index of the p-side composition graded layer 411 being highest, followed by the refractive index of the first layer 412A, and the refractive index of the second layer 412B. In the description herein, the average band gap energy refers to that obtained by multiplying each layer's band gap energy by the film thickness and dividing the sum of the products by the total film thickness. In the case of a composition graded layer, the average band gap energy is obtained by multiplying each sublayer's band gap energy by the film thickness, and dividing the sum of the products by the total film thickness. Similar calculations can be performed to obtain the average refractive index and the average composition ratio.

Disposing a second layer 412B can reduce light leakage to the second part 43, thereby reducing the free carrier absorption loss occurring in the second part 43. Including a second layer 412B having a lower refractive index than that of the first layer 412A in the p-side intermediate layer 412 allows the p-side intermediate layer 412 to have a smaller film thickness to achieve the same degree of optical confinement effect than a p-side intermediate layer 412 having a first layer 412A alone. As described above, the first part 41 preferably has a large thickness in order to reduce light leakage to the second part 43. On the other hand, it is effective for the first part 41 to have a small thickness in order to further reduce the voltage. Disposing a p-side composition graded layer 411 and a second layer 412B can reduce light leakage to the second part 43 while restraining the voltage from increasing.

Figure 2C:
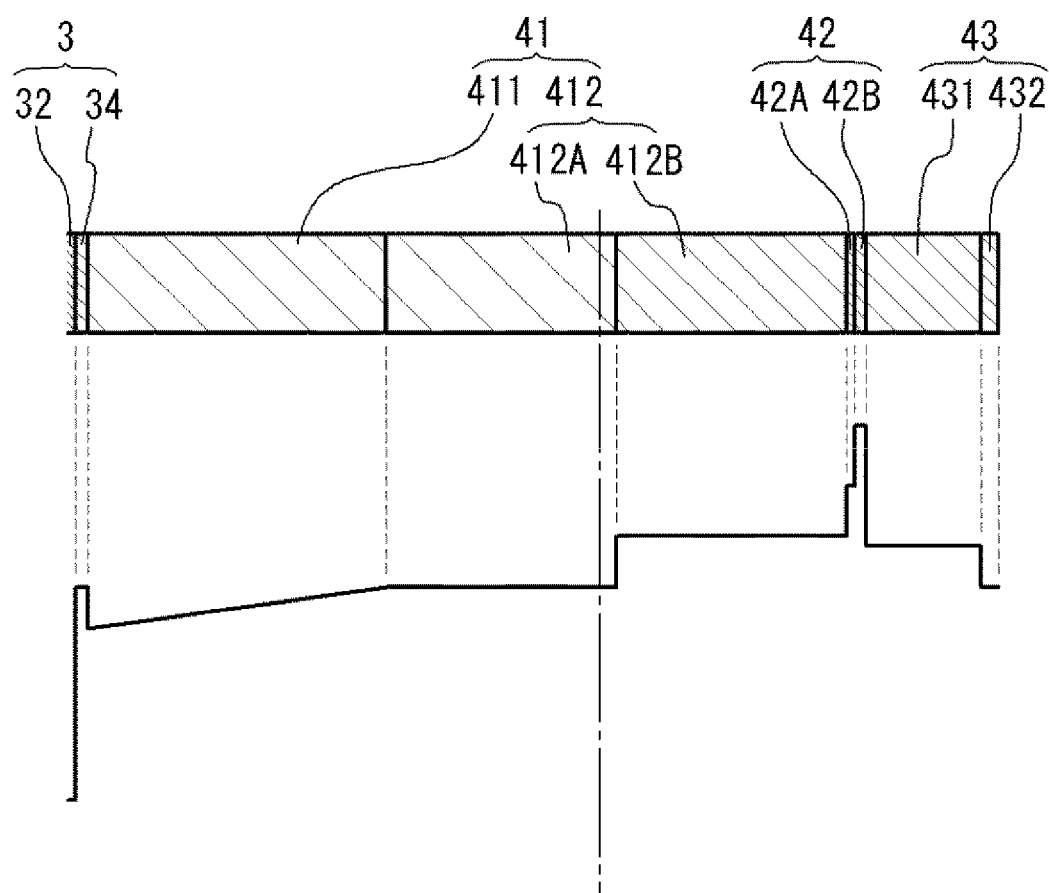
FIG. 2C is a schematic diagram of another example of the layer structure of the p-side semiconductor layer of the semiconductor laser element shown in FIG. 1.
Figure 2D:
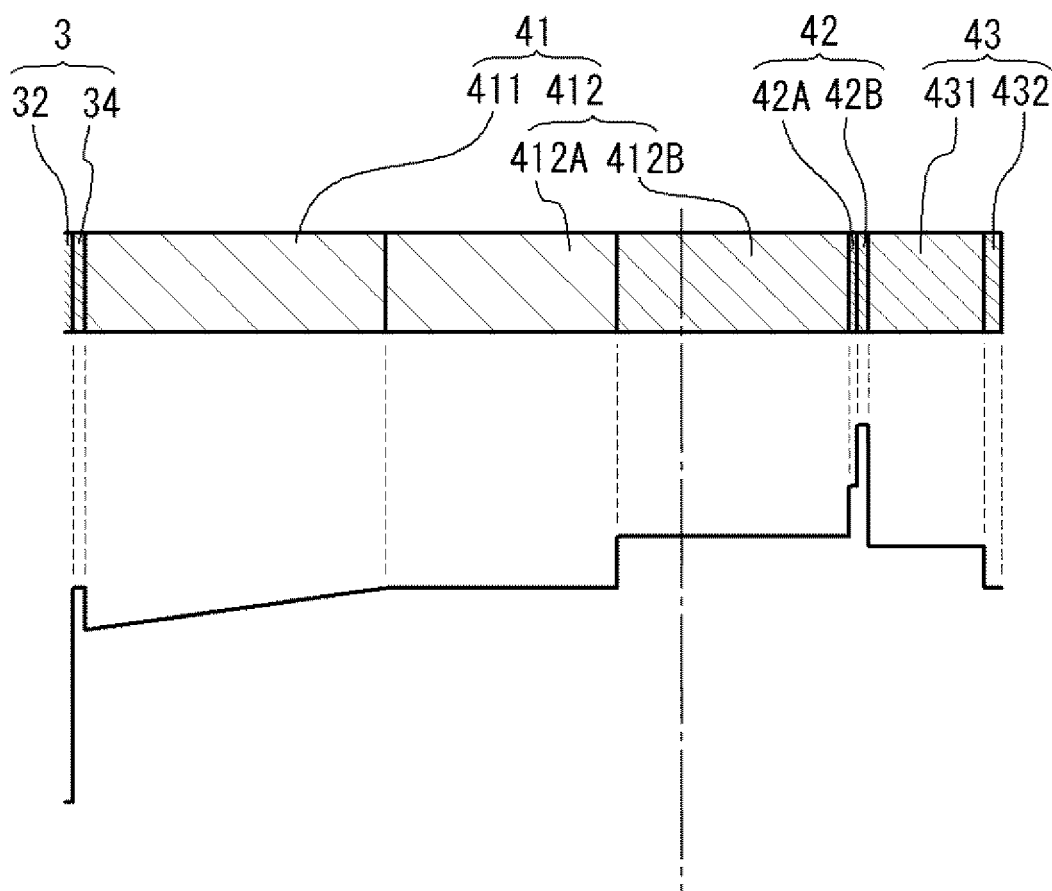
FIG. 2D is a schematic diagram of another example of the layer structure of the p-side semiconductor layer of the semiconductor laser element shown in FIG. 1.

In the case in which both the first layer 412A and the second layer 412B are single composition layers, the lower end of the ridge 4a is preferably positioned in either the first layer 412A or the second layer 412B. This can reduce the variation in the effective refractive index difference between inside and outside of the ridge 4a even when the lower end position of the ridge 4a varied during manufacturing as described above. The lower end of the ridge 4a may be positioned in the first layer 412A, as shown in FIG. 2B and FIG. 2C, or in the second layer 412B, as shown in FIG. 2D. The first layer 412A is, for example, a GaN layer. The second layer 412B is, for example, an AlGaN layer. In this case, the aluminum composition ratio of the second layer 412B can be set to at least 0.01% and 10% at most, for example. The film thickness of the second layer 412B can be set to at least 1 nm and 600 nm at most. In the case in which the refractive index of the second layer 412B is smaller than that of the first layer 412A, the film thickness of the second layer 412B is preferably larger than that of the first layer 412A. This can further enhance the effect of confining light to the active layer 3. For example, the second layer 412B is set to have a film thickness larger than that of the first layer 412A by at least 50 nm. In this case, moreover, because the first layer 412A has a smaller impact on optical confinement than the p-side composition graded layer 411 and the second layer 412B, reducing the thickness of the first layer 412A can reduce electrons overflowing from the active layer 3 while reducing the light leakage to the second part 43. This can improve the slope efficiency of the semiconductor laser element. From this perspective, the film thickness of the first layer 412A is preferably 100 nm at most, more preferably 50 nm at most. The film thickness of the first layer 412A, furthermore, is preferably set to one half of the thickness of the second layer 412B at most, more preferably one quarter at most. The film thickness of the first layer 412A can be set to at least 1 nm.

The second layer 412B, as shown in FIG. 2B, may have a larger band gap energy than the band gap energy of the layer in the second part 43 that is in contact with the electron barrier layer 42 (the lower p-type semiconductor layer 431 in FIG. 2B). Disposing such a layer having a relatively large band gap energy in the first part 41 is considered beneficial in reducing light leakage to the second part 43 that has a larger absorption loss than the first part 41. In this case, it is preferable to employ a material for the p-electrode 6 that can function as a clad layer. This eliminates the need for disposing a p-side clad layer in the second part 43, thereby reducing the bias voltage to be applied. This will be explained in detail below.

In the case of allowing the p-electrode 6 to function as a clad layer, a light transmissive material is used for the p-electrode 6, which can cause absorption loss to occur. For this reason, if there is much light leakage to the p-electrode 6 that needs to be reduced, a layer functioning as a p-type clad layer such as a p-type layer containing Al can be disposed in the second part 43. It is preferable for the aluminum composition ratio to be relatively high in order for the layer to function as a p-type clad layer, but the higher the aluminum composition ratio, the higher the activation energy for activating the p-type impurity in the layer will be required. Insufficient p-type conversion of the second part 43 increases the series resistance to increase the bias voltage to be applied. Accordingly, in the case of disposing a p-type clad layer in the second part 43, the acceptor concentration is increased by increasing the doped amount of the p-type impurity, for example. However, as described above, increasing the doped amount of a p-type impurity increases optical absorption losses and reduces optical output. In the case of a structure where an undoped AlGaN layer is disposed between the active layer 3 and the electron barrier layer 42 shown in FIG. 2B, the voltage hardly increases even if the aluminum composition ratio is increased because p-type conversion of the AlGaN layer is unnecessary. Moreover, in the case of an undoped AlGaN layer, the optical absorption loss hardly increases. An undoped layer generally has high resistance, and disposing such a layer tends to increase voltage, but disposing an undoped AlGaN layer in the first part 41 differs from the general trend. This is believed to be because donors function as the majority carriers and acceptors, requiring larger activation energy than donors, function as the minority carriers in the undoped AlGaN layer disposed between the active layer 3 and the electron barrier layer 42 when applying a bias voltage. Accordingly, an AlGaN layer having a relatively high aluminum composition ratio similar to the second layer 412B can be disposed in the first part 41. In other words, a layer having a large band gap energy can be disposed in the first part 41. Disposing such a layer can reduce the light leakage to the second part 43, which eliminates the need to dispose a p-type clad layer in the second part 43. That is, the aluminum composition ratio of the second part 43 can be reduced. This can reduce the series resistance of the second part 43, thereby lowering the voltage for the semiconductor laser element 100.

Figure 3A:
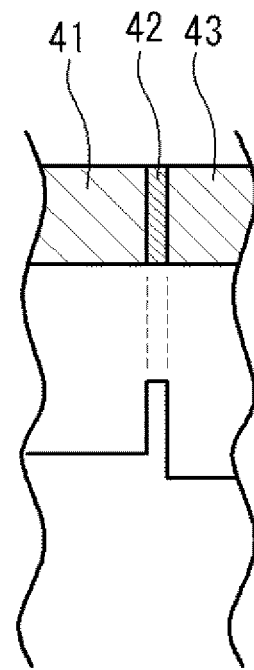
FIG. 3A is a schematic diagram of an example of the band gap energy of the uppermost layer of the first part, the electron barrier layer, and the lowermost layer of the second part.
Figure 3B:
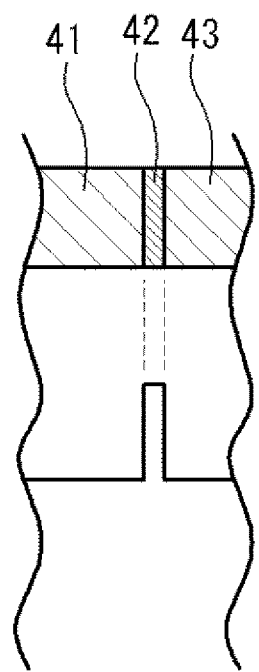
FIG. 3B is a schematic diagram of another example of the band gap energy of the uppermost layer of the first part, the electron barrier layer, and the lowermost layer of the second part.
Figure 3C:
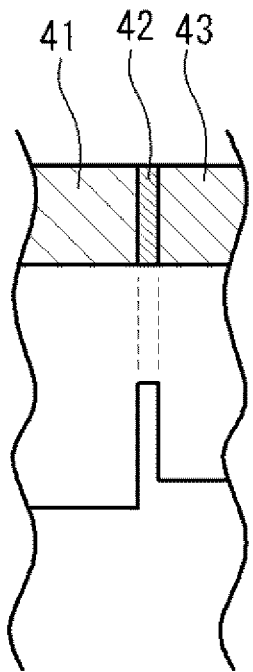
FIG. 3C is a schematic diagram of another example of the band gap energy of the uppermost layer of the first part, the electron barrier layer, and the lowermost layer of the second part.

FIG. 3A to FIG. 3C schematically show examples of the relative band gap energy of the uppermost layer of the first part 41, the electron barrier layer 42, and the lowermost layer of the second part 43. The uppermost layer of the first part 41 is in contact with the lower face of the electron barrier layer 42, and the lowermost layer of the second part 43 is in contact with the upper face of the electron barrier layer 42. In FIG. 3A, the lowermost layer's band gap energy is smaller than the uppermost layer's band gap energy. In FIG. 3B, the lowermost layer's band gap energy is equal to the uppermost layer's band gap energy. In FIG. 3C, the lowermost layer's band gap energy is larger than the uppermost layer's band gap energy. For the reasons stated above, as shown in FIG. 3A, the band gap energy of the lowermost layer of the second part 43 (e.g., the lower p-type semiconductor layer 431) is preferably smaller than the band gap energy of the uppermost layer of the first part 41 (e.g., the second layer 412B). This can reduce light leakage to the second part 43, and is suited for the structure that employs for the p-electrode 6 a material that functions as a clad layer. In the case of this construction, it is possible to lower the bias voltage to be applied to the semiconductor laser element 100. With regard to band gap energy magnitude relation, in the case in which the uppermost layer and/or the lowermost layer do not have constant band gap energy, such as a superlattice layer or composition graded layer, the magnitudes can be compared by using the average band gap energy. In the case of a superlattice layer, the average band gap energy of the superlattice layer is obtained by multiplying the band gap energy of each sublayer in the superlattice layer by the film thickness, followed by dividing the sum of the products by the total film thickness. In the case in which the uppermost and lowermost layers are AlGaN layers, the magnitude relation between band gap energy levels can otherwise be stated in terms of magnitude relation between Al ratios.

The lowermost layer can be an AlGaN layer having an aluminum composition ratio of 4% at most. The lowermost layer may be a layer having essentially zero aluminum composition ratio, i.e., a GaN layer. The lowermost layer, for example, can be a p-type semiconductor layer containing a p-type impurity such as Mg. The lowermost layer may be a quaternary semiconductor layer such as AlInGaN. The second part 43 that includes the lowermost layer preferably has an average aluminum composition ratio of 4% at most for the purpose of reducing voltage. The uppermost layer disposed in the first part 41 preferably has an Al content of at least 0.01% in part or in whole. More preferably, the average aluminum composition ratio of the uppermost layer is set higher than 4%. Moreover, the uppermost layer may have a larger band gap energy than that of any of the layers (may be a single layer) that make up the second part 43. The uppermost layer may be a superlattice layer or a composition graded layer that includes AlGaN or AlInGaN. The one or more layers connecting the uppermost layer and the active layer 3 can each be formed as a layer having a smaller band gap energy than the band gap energy of the uppermost layer. Such a layer or layers are, for example, the first layer 412A and the p-side composition graded layer 411 shown in FIG. 2B, but may be different from these layers.

A semiconductor laser element 100 may be constructed as described below. It has an n-side semiconductor layer 2, an active layer 3, and a p-side semiconductor layer 4, each made of a nitride semiconductor and successively disposed towards the top, and a ridge 4a projecting upward created in the p-side semiconductor layer 4. The p-side semiconductor layer 4 has: an undoped first part 41 disposed in contact with the upper face of the active layer 3 and having at least one semiconductor layer; an electron barrier layer 42 containing a p-type impurity disposed in contact with the upper face of the first part 41 and having a larger band gap energy than the first part 41; and a second part 43 disposed in contact with the upper face of the electron barrier layer 42 and having at least one p-type semiconductor layer containing a p-type impurity. The first part 41 has the uppermost layer in contact with the lower face of the electron barrier layer 42, and the second part 43 has the lowermost layer in contact with the upper face of the electron barrier layer 42, wherein the band gap energy of the lowermost layer is smaller than the band gap energy of the uppermost layer. The lower end of the ridge 4a is positioned in the first part 41.

Electron Barrier Layer 42

The electron barrier layer 42 contains a p-type impurity such as Mg or the like. The band gap energy of the electron barrier layer 42 is larger than the band gap energy of the first part 41. In the case in which the first part 41 is of a multilayer structure as described above, the electron barrier layer 42 is formed as a layer having a larger band gap energy than any of the layers making up the first part 41. The electron barrier layer 42 having a larger band gap energy as described above allows the electron barrier layer 42 to function as a barrier to the electrons overflowing from the active layer 3. The electron barrier layer 42 preferably has a band gap energy difference of at least 0.1 eV from the uppermost layer of the first part 41. The band gap energy difference between the two can be set, for example, to 1 eV at most. The electron barrier layer 42, for example, is formed as a layer having the highest band gap energy among all in the p-side semiconductor layer 4. The electron barrier layer 42 may be a layer having a smaller film thickness than the p-side composition graded layer 411. The electron barrier layer 42 may have a multilayer structure. In this case, the electron barrier layer 42 has a layer that has a larger band gap energy than any of the layers making up the first part 41. For example, as shown in FIG. 2A and others, it may have a first electron barrier layer 42A and a second electron barrier layer 42B. In the case in which a superlattice layer is included in the first part 41 or the electron barrier layer 42, the magnitudes are compared using the average band gap energy of the superlattice layer rather than the band gap energy of each layer making up the superlattice layer. The electron barrier layer 42 is made of AlGaN, for example. In the case of forming an electron barrier layer 42 with AlGaN, the aluminum composition ratio may be set in a range of 8 to 30%. The film thickness of the electron barrier layer 42 can be set, for example, to at least 5 nm, and 100 nm at most.

As shown in FIG. 2C and FIG. 2D, the shortest distance from the lower end of the ridge 4a to the electron barrier layer 42 is preferably larger than the shortest distance from the upper face of the ridge 4a to the electron barrier layer 42. Such an arrangement can keep the peak light intensity at a distance from the p-type impurity-containing parts such as the electron barrier layer 42 and the like, and can reduce the distance between the lower end of the ridge 4a and the active layer 3. The shortest distance from the lower end of the ridge to the electron barrier layer 42, in a cross-sectional view such as FIG. 1, refers to the shortest distance from a virtual straight line connecting the lower edges of ridge 4a to the lower face of the electron barrier layer 42. In other words, the electron barrier layer 42 can be said to be located closer to the top of the ridge 4a. Assuming that the shortest distance from the lower end of the ridge 4a to the active layer 3 is about 436 nm, for example, kinks might occur in the I-L characteristics curve. Accordingly, the shortest distance from the lower end of the ridge 4a to the active layer 3 is preferably 430 nm at most. This can enhance the optical confinement in the transverse direction.

Second Part 43

The second part 43 has at least one p-type semiconductor layer containing a p-type impurity. The concentration of the p-type impurity in a p-type semiconductor layer included in the second part 43 can be set to at least $1\times10^{18}$/cm$^3$ and $1\times10^{22}$/cm$^3$ at most, for example. Because drive voltage can be reduced by forming the second part 43 with a small thickness as described above, the thickness of the second part 43 is preferably 260 nm at most. The thickness of the second part 43 can be set to at least 10 nm. The second part 43 may include an undoped layer, but the presence of an undoped layer in the second part 43 increases the resistance of the second part 43. Thus, it is preferable that a p-type impurity is contained throughout the second part 43. In the case of a superlattice layer, the average p-type impurity concentration can be considered as the p-type impurity concentration of the superlattice layer. Thus, in the case in which the second part 43 includes a superlattice layer, the superlattice layer may have a structure in which an undoped layer and a p-type impurity-containing layer are stacked.

The second part 43 can have an upper p-type semiconductor layer 432 and a lower p-type semiconductor layer 431 as shown in FIG. 2A. The upper p-type semiconductor layer 432 constitutes the upper face of the ridge 4a. In other words, the upper p-type semiconductor layer 432 is the uppermost layer of the second part 43, i.e., the uppermost layer of the ridge 4a. The upper p-type semiconductor layer 432 functions as a p-side contact layer. The lower p-type semiconductor layer 431 is disposed between the upper p-type semiconductor layer 432 and the electron barrier layer 42, and has a larger band gap energy than the upper p-type semiconductor layer 432.

The lower p-type semiconductor layer 431 is made of, for example, AlGaN. The upper p-type semiconductor layer 432 is made of, for example, GaN. The lower p-type semiconductor layer 431 preferably has a band gap energy between that of the electron barrier layer 42 and the upper p-type semiconductor layer 432. Since AlGaN containing a p-type impurity tends to have a higher resistance than GaN containing a p-type impurity, the upper p-type semiconductor layer 432 is preferably a GaN layer to which a p-type impurity is doped. Disposing an AlGaN lower p-type semiconductor layer under the upper p-type semiconductor layer 432 can enhance the optical confinement to the active layer 3 as compared to the case in which the second part 43 is formed with a GaN layer alone. An aluminum composition ratio of the lower p-type semiconductor layer 431 being lower than the aluminum composition ratio of the electron barrier layer 42 can make the resistance of the lower p-type semiconductor layer 431 lower than that of the electron barrier layer 42. The lower p-type semiconductor layer 431 may be allowed to function as a p-side clad layer. The lower p-type semiconductor layer 431 may be formed as a p-type GaN layer, which can further reduce the resistance of the second part 43. In this case, it is preferable to form the p-electrode with a material such as ITO to allow it to function as a clad layer.

The film thickness of the upper p-type semiconductor layer 432 can be set to 5 to 30 nm, for example. The film thickness of the lower p-type semiconductor layer 431 can be set to 1 to 260 nm, for example. The film thickness of the lower p-type semiconductor layer 431 can be smaller than the film thickness of the p-side intermediate layer 412, and can further be smaller than the film thickness of the second layer 412B. The lower p-type semiconductor layer 431 and the second layer 412B may both be AlGaN layers, and they may have the same aluminum composition ratio. The lower p-type semiconductor layer 431 has a larger film thickness than, for example, the electron barrier layer 42. Accordingly, in order to reduce free carrier absorption losses, the p-type impurity concentration of the lower p-type semiconductor layer 431 is preferably lower than the p-type impurity concentration of the electron barrier layer 42.

Insulation Film 5, N-Electrode 8, P-Electrode 6, and P-Side Pad Electrode 7

The insulation film 5 can be formed as a single layer film or multilayer film made of, for example, an oxide, nitride, or the like of Si, Al, Zr, Ti, Nb, Ta, or the like. The n-electrode 8 is disposed, for example, across the entire lower face of the n-type substrate 1. The p-electrode 6 is disposed on the upper face of the ridge 4a. In the case in which the width of the p-electrode 6 is small, a p-side pad electrode 7 having a larger width than the p-electrode 6 can be formed on the p-electrode 6 and a wire or the like can be connected to the p-side pad electrode 7. Examples of materials employed for each electrode include a single layer film or multilayer film of metals such as Ni, Rh, Cr, Au, W, Pt, Ti, Al, their alloys, and a conductive oxide containing at least one selected from Zn, In, and Sn. Examples of conductive oxides include ITO (indium tin oxide), IZO (indium zinc oxide), GZO (gallium-doped zinc oxide), and the like. The electrodes can be of any thickness to function as electrodes for a semiconductor element, for example, in a range of about 0.1 µm to about 2 µm.

The p-electrode 6 is preferably a transparent conductive film having a smaller refractive index than the refractive index of the active layer 3. This allows the p-electrode 6 to function as a clad layer. Furthermore, the p-electrode 6 is preferably a transparent conductive film having a smaller refractive index than the refractive index of the second part 43. This can further enhance the optical confinement effect. In the case of disposing a p-side clad layer in the second part 43, a p-type impurity-doped AlGaN layer having a relatively high aluminum composition ratio, for example, is formed as the p-side clad layer. However, the resistance increases as the aluminum composition ratio increases. Allowing the p-electrode 6 to function as a clad layer can eliminate the need to dispose a p-side clad layer in the second part 43, or even in the case of disposing a p-side clad layer, the aluminum composition ratio thereof can be reduced. This can reduce the resistance, thereby reducing the drive voltage for the semiconductor laser element 100. An example of a p-electrode 6 that functions as a clad layer is a p-electrode 6 made of ITO.

Manufacturing Method

Figure 6A:
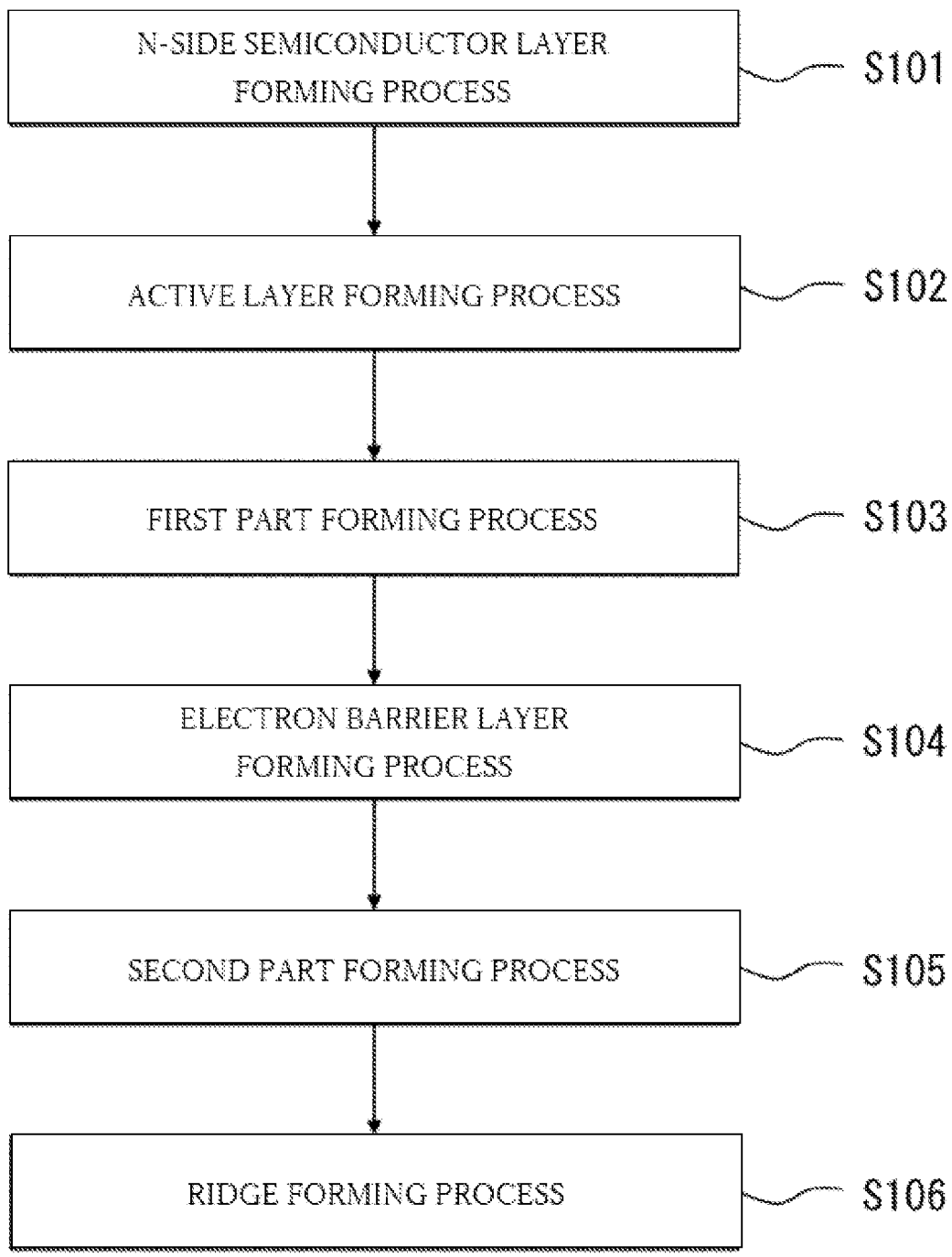
FIG. 6A is a flowchart of a method for manufacturing a semiconductor laser element according to one embodiment of the present invention.
Figure 6B:
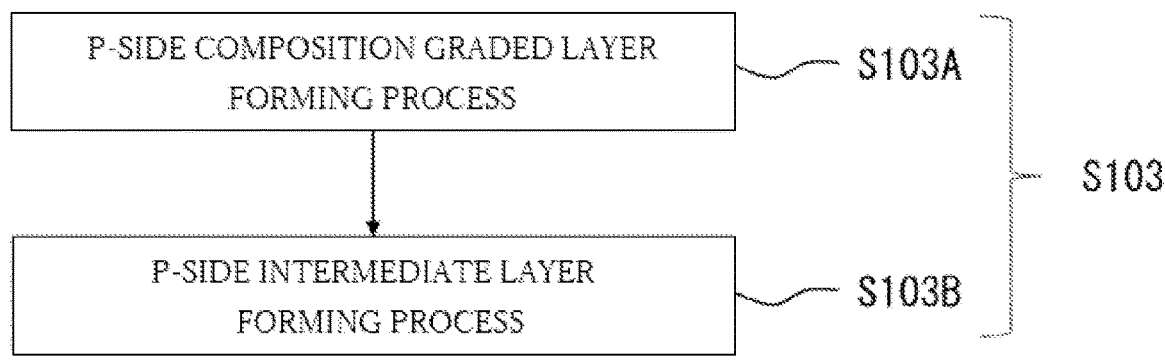
FIG. 6B is a flowchart of an example of process S103.

A method for manufacturing a semiconductor laser element 100 according to one embodiment can include the processes S101 to S106 shown in the flowchart in FIG. 6A. In the process S101, an n-side semiconductor layer 2 is formed on a substrate 1. In the process S102, an active layer 3 is formed on the n-side semiconductor layer 2. In the process S103, a first part 41 having at least one semiconductor layer is formed undoped on the upper face of the active layer 3. In the process S104, an electron barrier layer 42 having a larger band gap energy than that of the first part 41 is formed by doping with a p-type impurity on the upper face of the first part 41. In the process S105, a second part 43 having at least one p-type semiconductor layer doped with a p-type impurity is formed on the upper face of the electron barrier layer 42. In the process S106, a ridge 4a projecting upward is formed by partially removing the p-side semiconductor layer 4 that includes the first part 41, the electron barrier layer 42, and the second part 43. By following these processes, a semiconductor laser element 100 having an n-side semiconductor layer 2, an active layer 3, and a p-side semiconductor layer 4 successively disposed towards the top, and a ridge 4a projecting upward created in the p-side semiconductor layer, can be produced. The operation, effect, preferable composition, and the like of each layer obtained by each process are as described above. For example, as shown in FIG. 6B, the process S103 of forming a first part 41 can include a process S103A of forming an undoped p-side composition graded layer 411 in which the band gap energy increases towards the top, and a process S103B of forming an undoped p-side intermediate layer 412 above the p-side composition graded layer 411. In this case, in the process S106 of forming a ridge 4a, the p-side semiconductor layer 4 can be partially removed such that the lower edge of the ridge 4a is positioned in the p-side intermediate layer 412. Moreover, in the process S105 of forming a second part 43, a second part 43 having a smaller thickness than that of the first part 41 can be formed. In this case, in the process S106 of forming a ridge 4a, the p-side semiconductor layer 4 can be partially removed such that the lower end of the ridge 4a is positioned in the first part 41. Furthermore, in the process S105 of forming a second part 43, a layer having a smaller band gap energy than that of the uppermost layer of the first part 41 may be formed as the lowermost layer of the second part 43.

Example 1

A semiconductor laser element having the p-side semiconductor layer 4 shown in FIG. 2A and FIG. 4 was prepared as Example 1. An MOCVD system was used to prepare an epitaxial wafer for the semiconductor laser elements. For the raw materials, trimethylgallium (TMG), triethylgallium (TEG), trimethylaluminum (TMA), trimethylindium (TMI), ammonia ($NH_3$), silane gas, and bis(cyclopentadienyl)magnesium ($Cp_2Mg$) were used as appropriate.

On an n-type GaN substrate having a +C plane as the upper face (substrate 1), an n-side semiconductor layer 2, an active layer 3, and a p-side semiconductor layer 4 were grown.

First, for the n-side semiconductor layer 2, a Si-doped $Al_{0.018}Ga_{0.982}N$ layer of 1.0 µm in thickness (underlayer 21), a Si-doped $Al_{0.08}Ga_{0.92}N$ layer of 250 nm in thickness (first n-side clad layer 22), a Si-doped $Al_{0.04}Ga_{0.96}N$ layer of 150 nm in thickness (crack suppressing layer 23), a Si-doped GaN layer of 10 nm in thickness (intermediate layer 24), a Si-doped $Al_{0.08}Ga_{0.92}N$ layer of 650 nm in thickness (second n-side clad layer 25), a Si-doped GaN layer of 200 nm in thickness (first n-side optical guide layer 26), an undoped $In_{0.03}Ga_{0.97}N$ layer of 260 nm in thickness (second n-side optical guide layer 27), a Si-doped GaN layer of 1.2 nm in thickness (first hole blocking layer 281), and a Si-doped $In_{0.05}Ga_{0.95}N$ layer of 4 nm in thickness (second hole blocking layer 282) were grown in that order.

Next, an active layer 3 was grown that included a Si-doped GaN layer (n-side barrier layer 31), an undoped $In_{0.25}Ga_{0.75}N$ layer (well layer 32), an undoped GaN layer (intermediate barrier layer), an undoped $In_{0.25}Ga_{0.75}N$ layer (well layer 32), and an undoped GaN layer (p-side barrier layer 34) in that order.

Next, as the p-side semiconductor layer 4, an undoped composition graded layer of 260 nm in thickness (p-side composition graded layer 411), an undoped GaN layer of 200 nm in thickness (p-side intermediate layer 412), a Mg-doped $Al_{0.10}Ga_{0.90}N$ layer of 3.9 nm in thickness (first electron barrier layer 42A), a Mg-doped $Al_{0.16}Ga_{0.84}N$ layer of 7 nm in thickness (second electron barrier layer 42B), a Mg-doped $Al_{0.04}Ga_{0.96}N$ layer of 300 nm in thickness (lower p-type semiconductor layer 431), and a Mg-doped GaN layer of 15 nm in thickness (upper p-type semiconductor layer 432) were grown in that order.

The p-side composition graded layer 411 was grown by substantially monotonically reducing the Indium composition ratio in 120 steps such that the composition slope is substantially a straight line starting from $In_{0.05}Ga_{0.95}N$ and ending with GaN.

Then the epitaxial wafer having the layers described above was removed from the MOCVD system, and a ridge 4a, an insulation film 5, a p-electrode 6, a p-side pad electrode 7, and an n-electrode 8 were formed. Then a reflecting film was formed on the light emitting facet and the light reflecting facet, and the wafer was divided into individual semiconductor laser elements 100. The depth of the ridge 4a was set to about 340 nm. In other words, the ridge 4a was formed so that the lower end was positioned in the first layer 412A. For the p-electrode 6, an ITO film of 200 nm in film thickness was formed. The peak wavelength of the laser light emitted by the semiconductor laser element 100 of Example 1 was about 530 nm.

Example 2

A semiconductor laser element having the p-side semiconductor layer 4 shown in FIG. 2B was prepared as Example 2. In other words, the semiconductor laser element prepared was similar to Example 1 except that an undoped $Al_{0.05}Ga_{0.95}N$ layer of 100 nm in thickness (second layer 412B) was formed in addition to the first layer 412A as the p-side intermediate layer 412, and the lower p-type semiconductor layer 431 was formed to be 200 nm in thickness.

Example 3

A semiconductor laser element having the p-side semiconductor layer 4 shown in FIG. 2C was prepared as Example 3. In other words, the semiconductor laser element prepared was similar to Example 2 except that the second layer 412B was 200 nm in thickness and the lower p-type semiconductor layer 431 was 100 nm in thickness.

Example 4

A semiconductor laser element similar to Example 3 except that the thickness of the first layer 412A was 100 nm was prepared as Example 4.

Example 5

A semiconductor laser element similar to Example 3 except that the thickness of the first layer 412A was 50 nm was prepared as Example 5.

Example 6

A semiconductor laser element having the p-side semiconductor layer 4 shown in FIG. 2D was prepared as Example 6. The semiconductor laser element of Example 6 was similar to Example 3 except that the depth of the ridge 4a was 270 nm. In other words, the semiconductor laser elements of Examples 1 to 5 were such that the lower end of the ridge 4a was positioned in the first layer 412A, whereas the semiconductor laser element of Example 6 was such that the lower end of the ridge 4a was positioned in the second layer 412B.

Comparative Examples 1-4

A semiconductor laser element similar to Example 1 except that the depth of the ridge 4a was 270 nm was prepared as Comparative Example 1. In other words, in the semiconductor laser element of Comparative Example 1, the ridge 4a was formed such that the lower end of the ridge is positioned in the lower p-type semiconductor layer 431. Semiconductor laser elements similar to Comparative Example 1 except that the p-side intermediate layer 412 has different film thicknesses were prepared as Comparative Examples 2 and 3. The film thickness of the p-side intermediate layer 412 was 300 nm in Comparative Example 2, and 400 nm in Comparative Example 3. A semiconductor laser element similar to Comparative Example 1 except for not having a p-side intermediate layer 412 was prepared as Comparative Example 4. In other words, in all of the semiconductor laser elements of Comparative Examples 1 to 4, the lower end of the ridge 4a was positioned in the lower p-type semiconductor layer 431. The shortest distance from the active layer 3 to the electron barrier layer 42 becomes larger in the order of Comparative Examples 4, 1, 2, and 3. The peak wavelength of the laser light emitted by any of Comparative Examples 1 to 4 was about 525 nm.

Test Result 1

Figure 8:
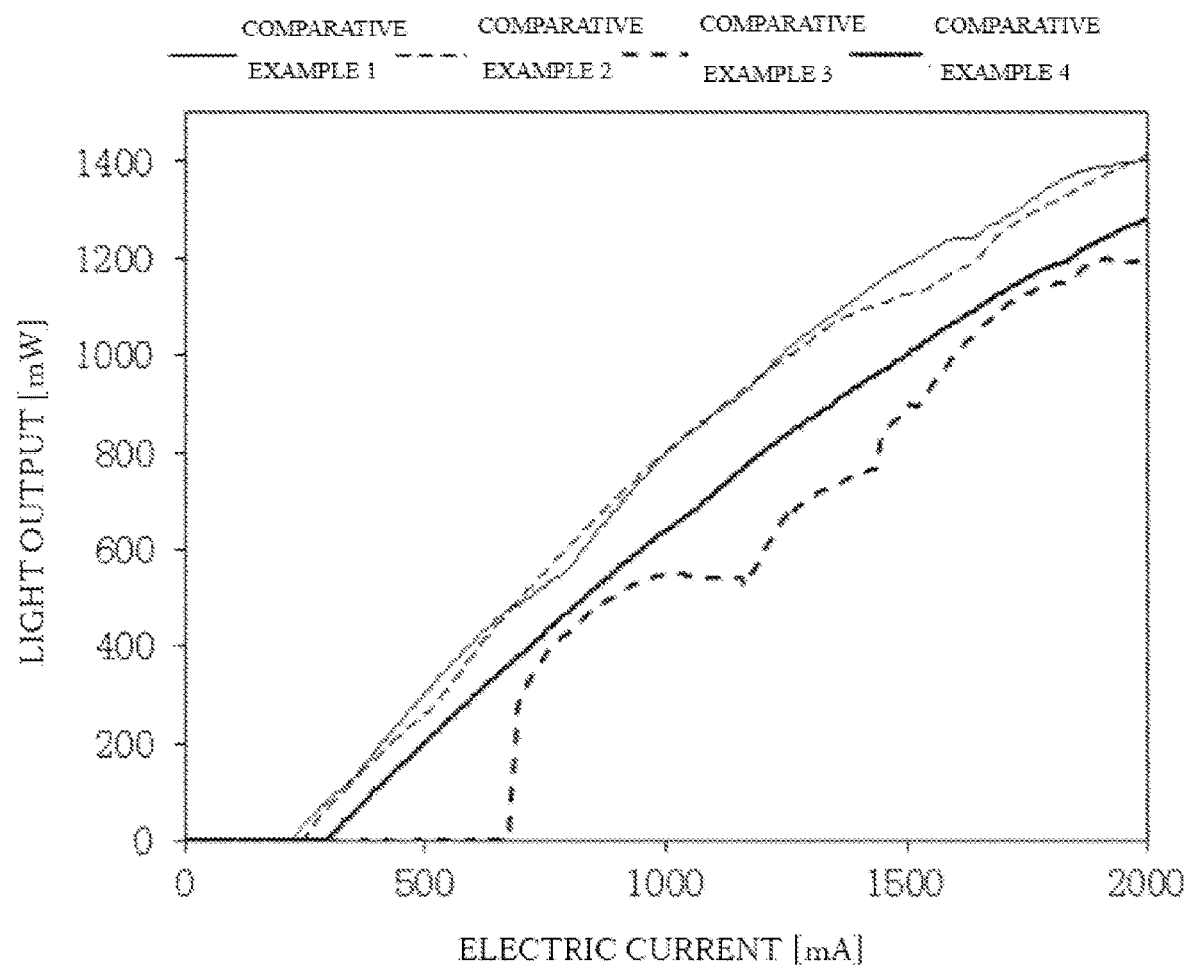
FIG. 8 is a graph showing the I-L characteristics of the semiconductor laser elements of Comparative Examples 1 to 4.

FIG. 8 shows the I-L characteristics of the semiconductor lasers of Comparative Examples 1 to 4. In the graph shown in FIG. 8, the horizontal axis represents electric current and the vertical axis represents light output. In FIG. 8, the thin solid line represents Comparative Example 1, the thin broken line represents Comparative Example 2, the thick broken line represents Comparative Example 3, and the thick solid line represents Comparative Example 4. As shown in FIG. 8, for Comparative Examples 1 to 4, all of which had the lower end of the ridge 4a positioned higher than the electron barrier layer 42, the I-L characteristics became more unstable as the shortest distance from the active layer 3 to the electron barrier layer 42 increased. Comparative Examples 1 and 2 had higher light output and higher slope efficiency than Comparative Example 4, but had kinks occurring in the I-L characteristic curves. In the semiconductor laser elements of Comparative Examples 1 and 2, because the distance from the active layer 3 to the lower end of the ridge 4a was increased by disposing the p-side intermediate layer 412, the effective refractive index difference between inside and outside of the ridge 4a was reduced as compared to Comparative Example 4. This is believed to have made the horizontal transverse mode of the semiconductor laser elements of Comparative Examples 1 and 2 unstable to allow the kinks to occur. The semiconductor laser element of Comparative Example 3 that had a thicker p-side intermediate layer 412 not only allowed kinks to occur, but also had a lower light output than the semiconductor laser element of Comparative Example 4. As described above, when the lower end of the ridge 4a was positioned higher than the electron barrier layer 42, the I-L characteristics were unstable, allowing kinks to occur, even with an attempt to improve the efficiency by disposing a p-side intermediate layer 412.

Test Result 2

Figure 9A:
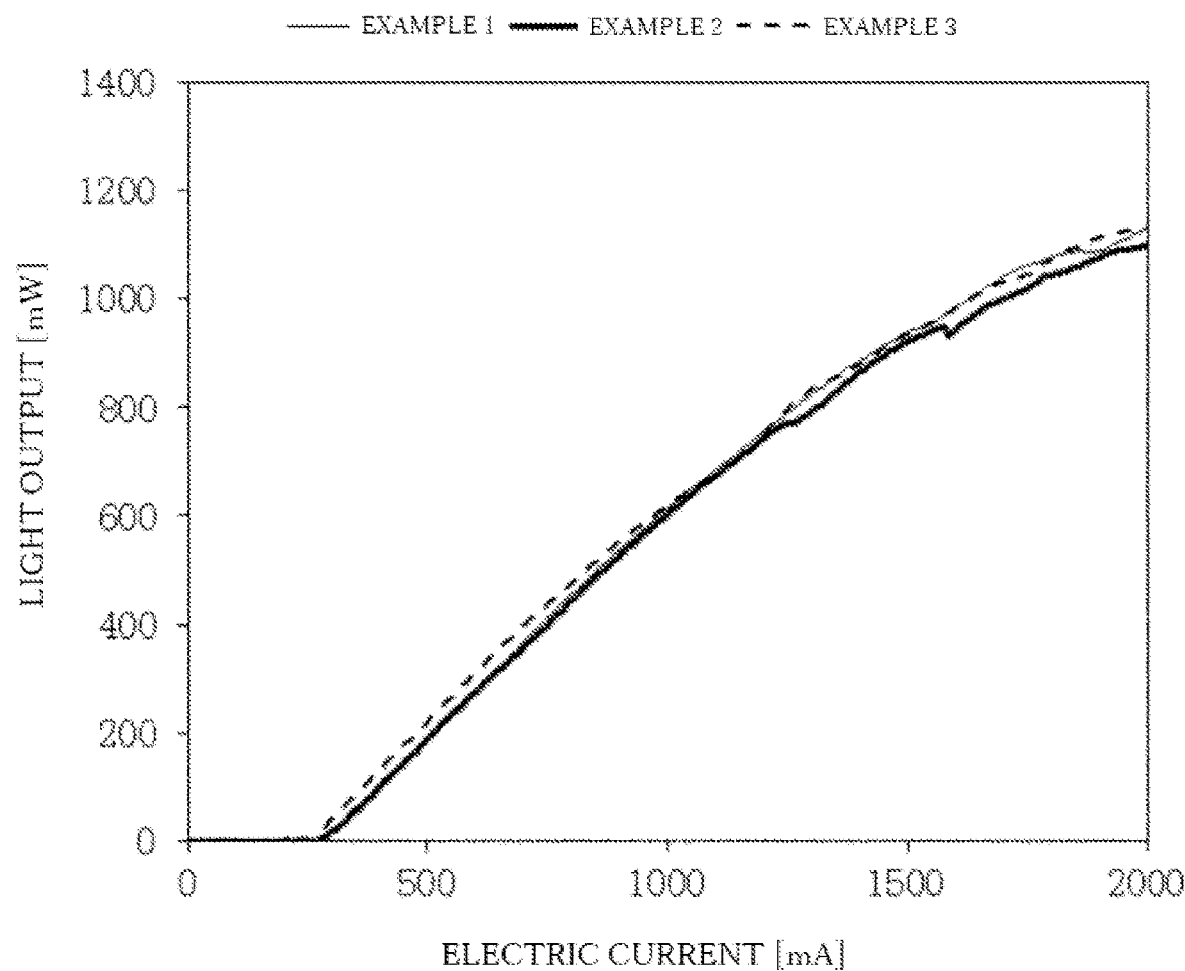
FIG. 9A is a graph showing the I-L characteristics of the semiconductor laser elements of Examples 1 to 3.
Figure 9B:
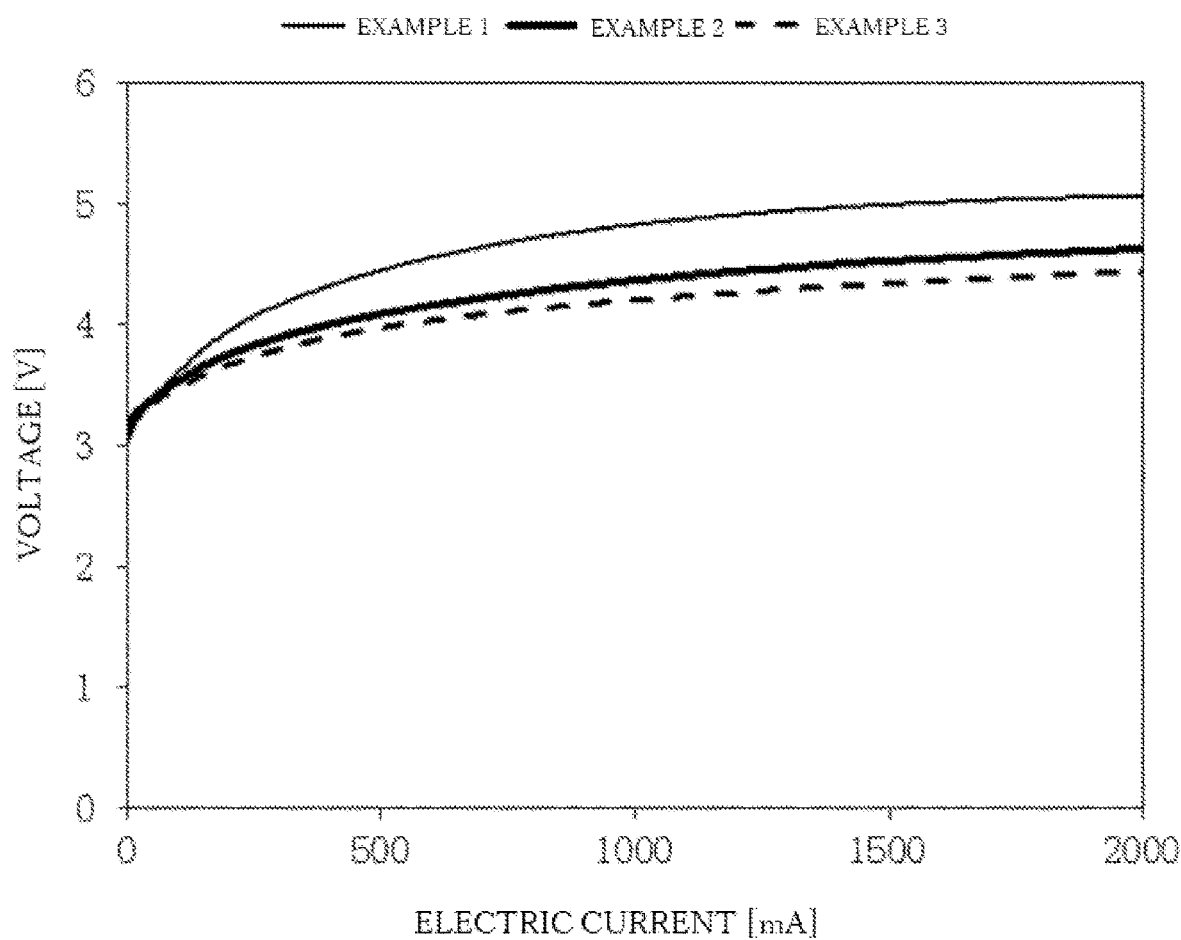
FIG. 9B is a graph showing the I-V characteristics of the semiconductor laser elements of Examples 1 to 3.

FIG. 9A shows the I-L characteristics and FIG. 9B shows the I-V characteristics of the semiconductor laser elements of Examples 1 to 3. In the graph shown in FIG. 9A, the horizontal axis represents electric current, and the vertical axis represents light output. In the graph shown in FIG. 9B, the horizontal axis represents electric current and the vertical axis represents voltage. In both FIG. 9A and FIG. 9B, the thin solid line represents Example 1, the thick solid line represents Example 2, and the broken line represents Example 3. Examples 1-3 and Comparative Examples 1-3 will be compared first by using FIG. 8 and FIG. 9A. The shortest distance from the active layer 3 to the electron barrier layer 42 in Example 1 is the same as that in Comparative Example 1; that in Example 2 is the same as that in Comparative Example 2; that in Example 3 is the same as that in Comparative Example 3. As can be understood from FIG. 8 and FIG. 9A, in the cases of Comparative Examples 1 to 3, the I-L characteristics became more unstable as the distance from the active layer 3 to the electron barrier layer 42 increased. In Examples 1 to 3, on the other hand, the I-L characteristics were substantially the same regardless of the distance from the active layer 3 to the electron barrier layer 42. This is believed to be attributable to enhanced optical confinement in the transverse direction by the more deeply formed ridge 4a in the semiconductor laser elements 100 of Examples 1 to 3, which stabilized the horizontal transverse mode. Comparative Examples 1 to 3 had a higher light output than Examples 1 to 3, but this is because Comparative Examples 1 to 3 had a shorter emission wavelength, i.e., it cannot be said that the differences in the depth of the ridge 4a caused the differences in the light output.

The film thickness of the lower p-type semiconductor layer 431 becomes smaller in the order of Example 1, Example 2, and Example 3. As shown in FIG. 9B, reducing the thickness of the lower p-type semiconductor layer 431 was confirmed to reduce the voltage for driving the semiconductor laser elements 100. This is believed to be because the lower p-type semiconductor layer 431 being an AlGaN layer had a relatively high series resistance. The second layer 412B is also an AlGaN layer, and disposing such an undoped AlGaN layer in the p-side semiconductor layer 4 could occasionally increase electrical resistance to thereby reduce hole injection probability, but this effect was not observed in the results shown in FIG. 9A and FIG. 9B. This is believed to be attributable to band bending in the second layer 412B during voltage application, which facilitated hole injection. In addition, it is believed that the first part 41 is filled with the electrons, which overflowed from the active layer 3 during voltage application.

Test Result 3

Figure 10A:
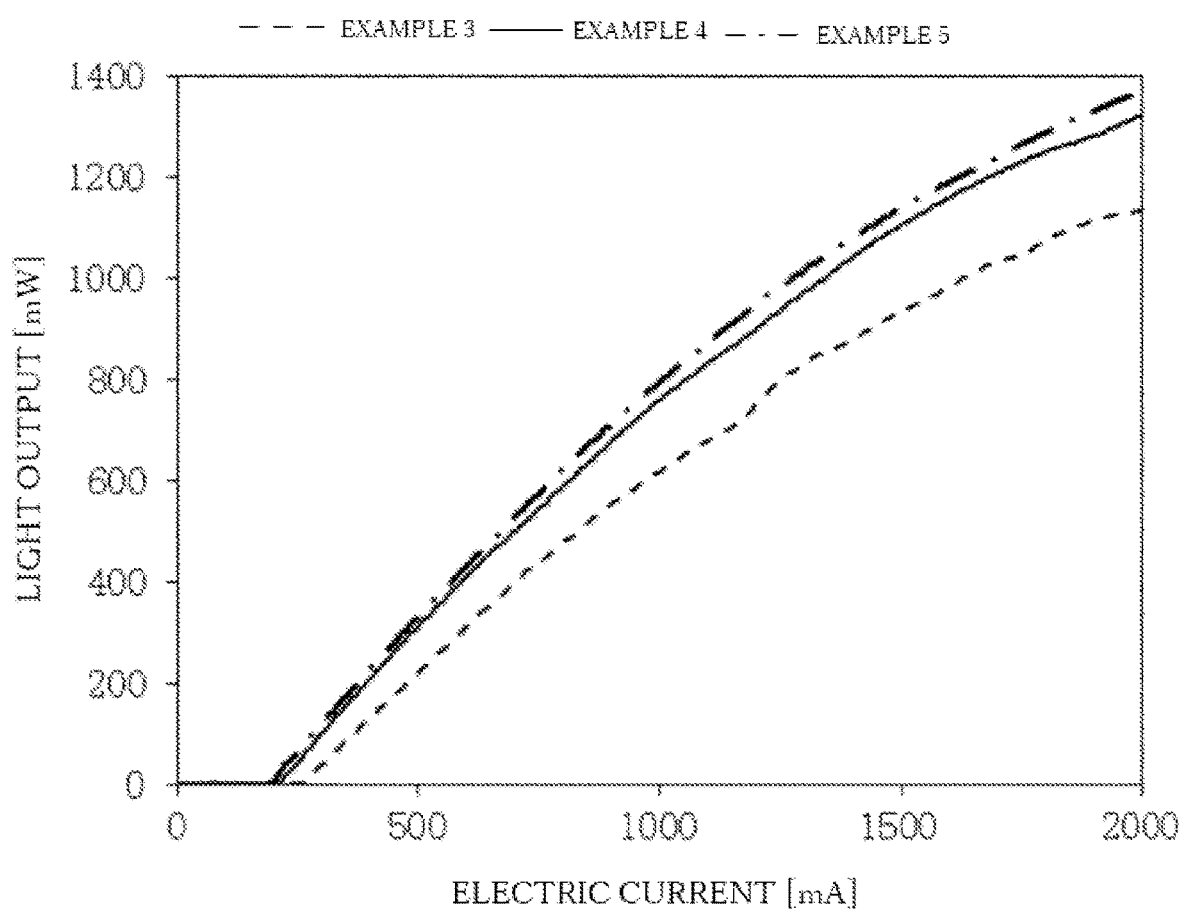
FIG. 10A is a graph showing the I-L characteristics of the semiconductor laser elements of Examples 3 to 5.
Figure 10B:
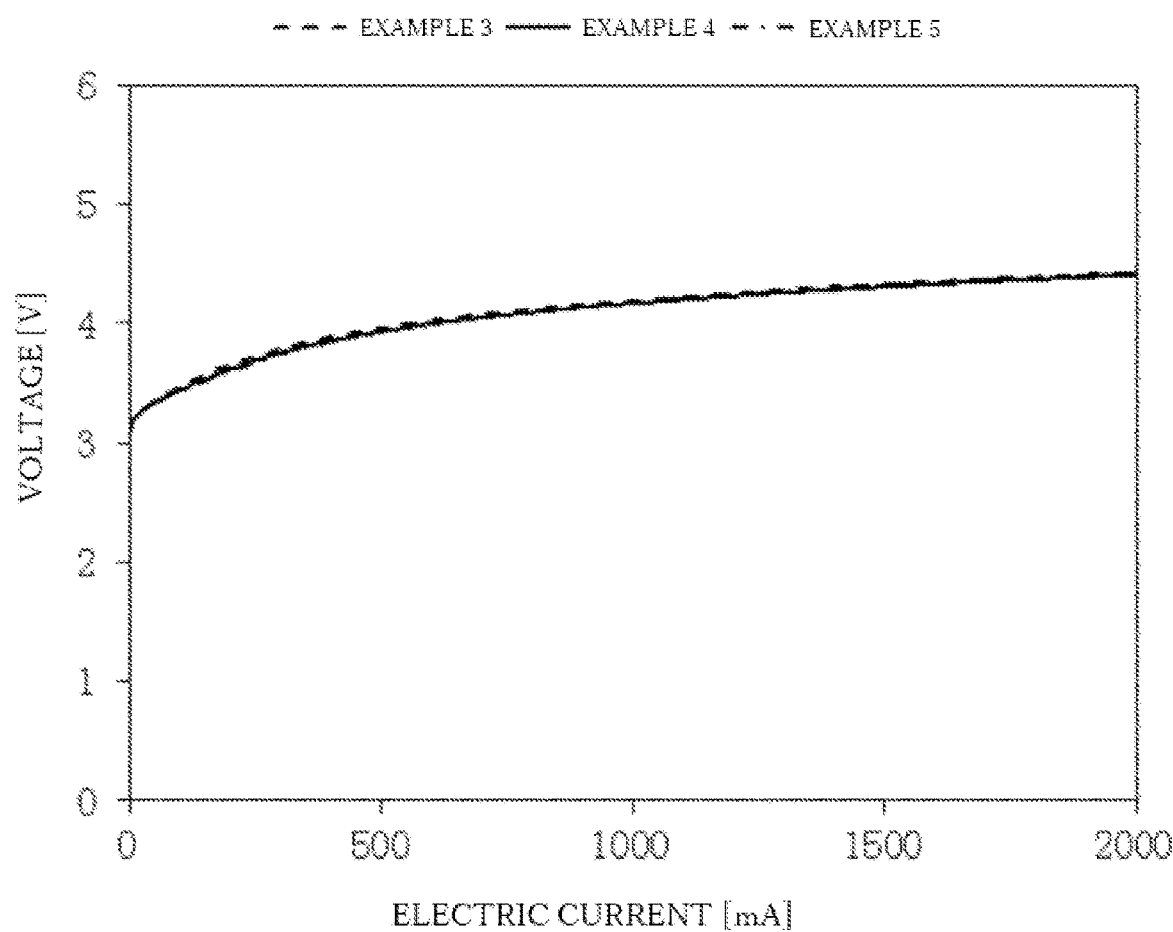
FIG. 10B is a graph showing the I-V characteristics of the semiconductor laser elements of Examples 3 to 5.

FIG. 10A shows the I-L characteristics and FIG. 10B shows the I-V characteristics of the semiconductor laser elements of Examples 3 to 5. In the graph shown in FIG. 10A, the horizontal axis represents electric current, and the vertical axis represents light output. In the graph shown in FIG. 10B, the horizontal axis represents electric current, and the vertical axis represents voltage. In both FIG. 10A and FIG. 10B, the broken line represents Example 3, the solid line represents Example 4, and the one-dot chain line represents Example 5. The thickness of the first layer 412A becomes smaller in the order of Examples 3, 4, and 5. As shown in FIG. 10A, reducing the film thickness of the first layer 412A was confirmed to increase the slope efficiency. As described above, keeping the electron barrier layer 42 and the second part 43 that contain a p-type impurity at a distance from the active layer 3 can reduce light leakage Γp to the second part 43 having a large free carrier absorption loss. On the other hand, electron overflow from the active layer 3 increases as the electron barrier layer 42 becomes more distant from the active layer 3. It is believed that reducing the film thickness of the first layer 412A that has less impact on optical confinement than the p-side composition graded layer 411 and the second layer 412B can reduce the light leakage to the second part 43 while attenuating an electron overflow increase, thereby increasing the slope efficiency. As shown in FIG. 10B, moreover, it was confirmed that a change in the thickness of the first layer 412A hardly affected the drive voltage.

Test Result 4

Figure 11A:
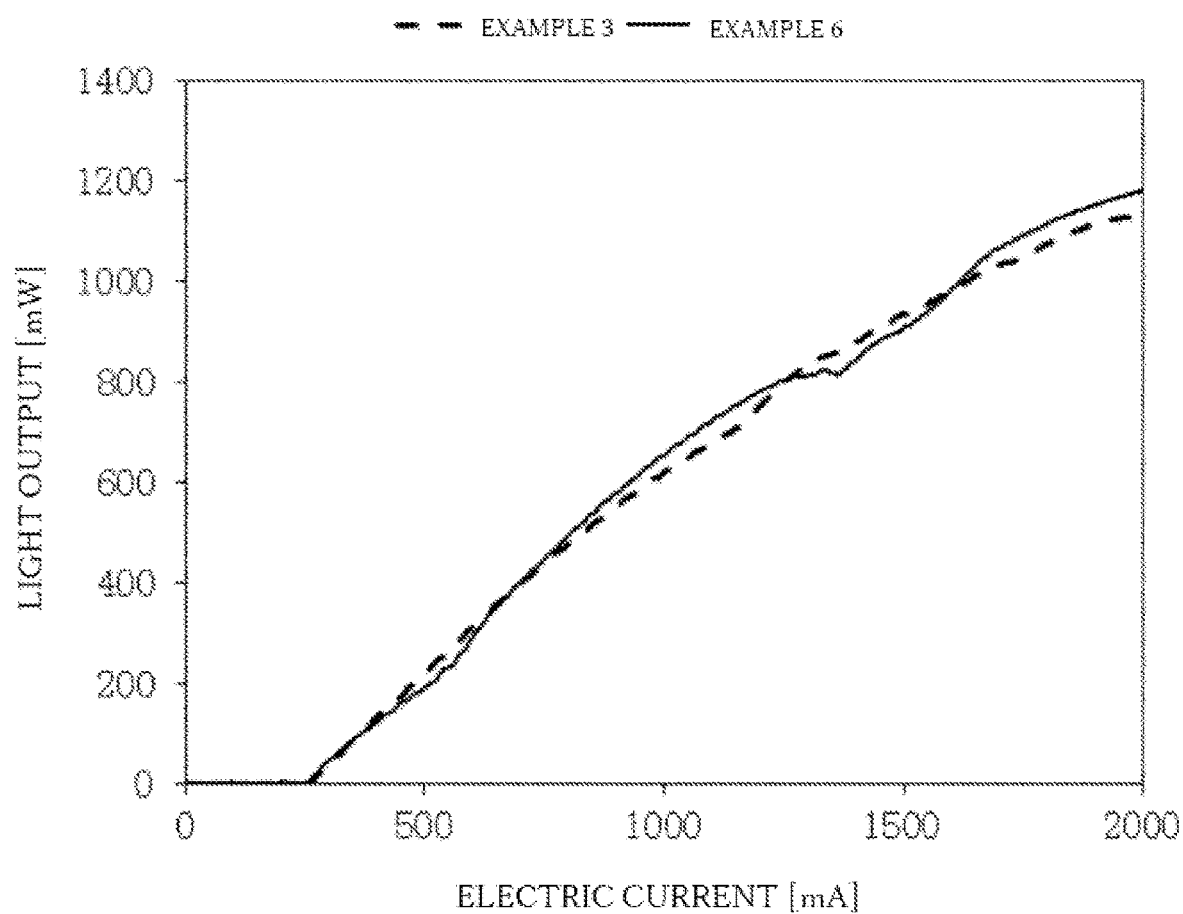
FIG. 11A is a graph showing the I-L characteristics of the semiconductor laser elements of Examples 3 and 6.
Figure 11B:
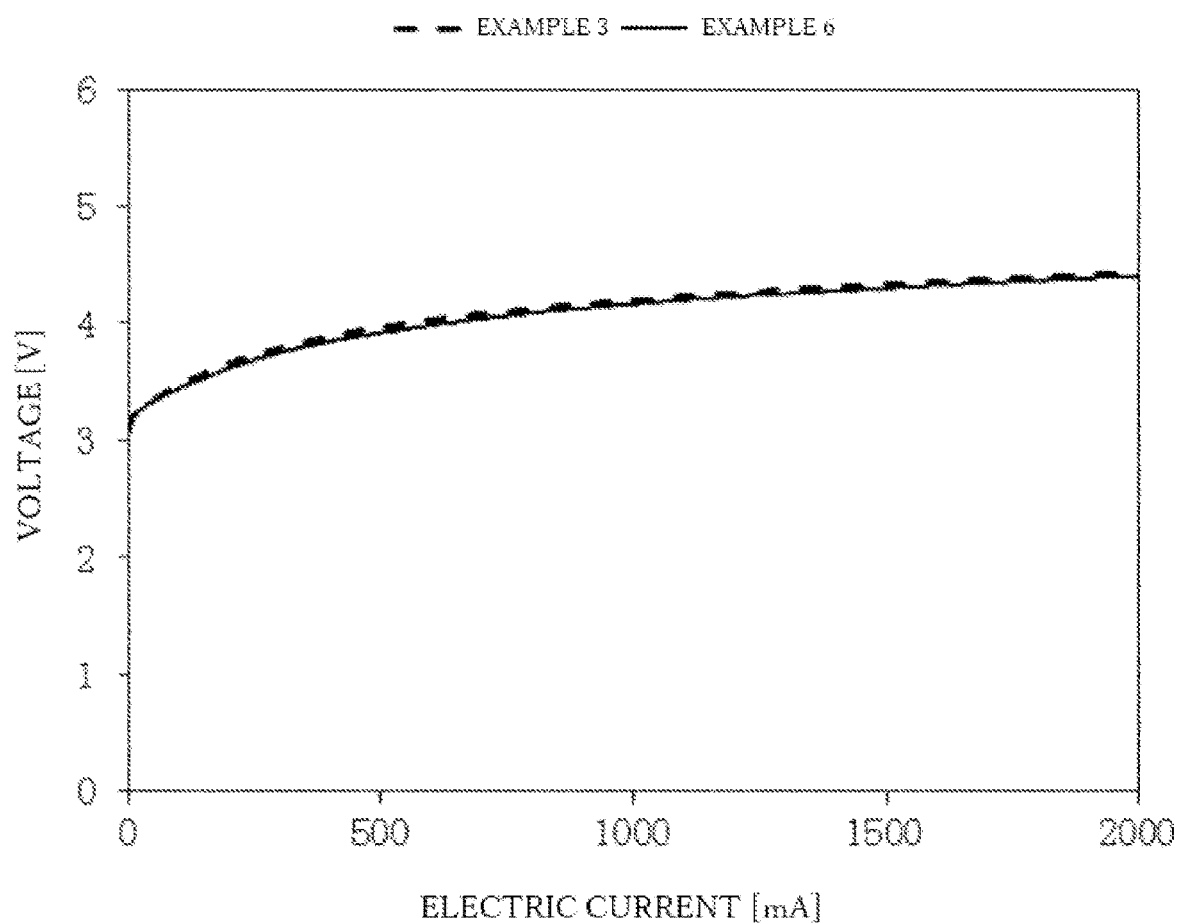
FIG. 11B is a graph showing the I-V characteristics of the semiconductor laser elements of Examples 3 and 6.

FIG. 11A shows the I-L characteristics and FIG. 11B shows the I-V characteristics of the semiconductor laser elements of Examples 3 and 6. In the graph shown in FIG. 11A, the horizontal axis represents electric current, and the vertical axis represents light output. In the graph shown in FIG. 11B, the horizontal axis represents electric current, and the vertical axis represents voltage. In both FIG. 11A and FIG. 11B, the broken line represents Example 3, and the solid line represents Example 6. Although the depth of the ridge 4a in Example 6 is smaller than Example 3, they demonstrated similar characteristics, as shown in FIG. 11A and FIG. 11B.

What is claimed is:

1. A semiconductor laser element comprising:
    an n-side semiconductor layer formed of a nitride semiconductor;
    an active layer disposed on or above the n-side semiconductor layer and formed of a nitride semiconductor;
    a p-side semiconductor layer disposed on the active layer, formed of a nitride semiconductor, and comprising:
        an undoped first part directly abutting an upper face of the active layer and comprising at least one semiconductor layer,
        an electron barrier layer directly abutting an upper face of the first part, containing a p-type impurity, and having a band gap energy that is larger than a band gap energy of the first part, and
        a second part directly abutting the upper face of the electron barrier layer and comprising at least one p-type semiconductor layer containing a p-type impurity; and
    a p-electrode directly abutting the upper face of the second part; wherein:
    at least a portion of the p-side semiconductor layer forms a ridge projecting upward and having an upper face and a lower end;
    a total thickness of the second part is smaller than a total thickness of the first part; and
    the lower end of the ridge is positioned at the first part.

2. The semiconductor laser element according to claim 1, wherein:
    the first part comprises an uppermost layer directly abutting a lower face of the electron barrier layer;
    the second part comprises a lowermost layer directly abutting the upper face of the electron barrier layer; and
    the lowermost layer has a band gap energy that is smaller than a band gap energy of the uppermost layer.

3. The semiconductor laser element according to claim 1, wherein the total thickness of the first part is at least 400 nm.

4. The semiconductor laser element according to claim 1, wherein the total thickness of the second part is 260 nm at most.

5. The semiconductor laser element according to claim 1, wherein a shortest distance from the lower end of the ridge to the electron barrier layer is larger than a shortest distance from the upper face of the ridge to the electron barrier layer.

6. The semiconductor laser element according to claim 1, wherein:
    the p-electrode is disposed directly abutting the upper face of the ridge; and
    the p-electrode is a transparent conductive film having a refractive index that is smaller than a refractive index of the second part.

7. The semiconductor laser element according to claim 1, wherein the semiconductor laser element is configured to emit laser light having a wavelength of at least 530 nm.

8. A method for manufacturing a semiconductor laser element, the method comprising:
    forming an n-side semiconductor layer on or above a substrate;
    forming an active layer on or above the n-side semiconductor layer;
    forming an undoped first part directly abutting an upper face of the active layer, the undoped first part comprising at least one semiconductor layer;
    forming an electron barrier layer directly abutting an upper face of the uppermost layer, the electron barrier layer being doped with a p-type impurity and having a band gap energy that is larger than a band gap energy of the first part;
    forming a second part directly abutting an upper face of the electron barrier layer, the second part comprising at least one p-type semiconductor layer doped with a p-type impurity;
    forming a p-electrode directly abutting an upper face of the second part; and
    forming a ridge projecting upward by partially removing a portion of a p-side semiconductor layer including a portion of the first part, a portion of the electron barrier layer, and a portion of the second part; wherein:
    in said forming the second part, the second part is formed so as to have a total thickness that is smaller than a total thickness of the first part; and
    in said forming the ridge, the p-side semiconductor layer is partially removed such that a lower end of the ridge is positioned at the first part.

9. A semiconductor laser element comprising:
    an n-side semiconductor layer formed of a nitride semiconductor;
    an active layer disposed on or above the n-side semiconductor layer and formed of a nitride semiconductor;
    a p-side semiconductor layer disposed on the active layer, formed of a nitride semiconductor, and comprising:
        an undoped first part an upper face of the active layer and comprising at least one semiconductor layer,
        an electron barrier layer an upper face of the first part, containing a p-type impurity, and having a band gap energy that is larger than a band gap energy of the first part, and
        a second part the upper face of the electron barrier layer and comprising at least one p-type semiconductor layer containing a p-type impurity; and
    a p-electrode the upper face of the second part; wherein:
    at least a portion of the p-side semiconductor layer forms a ridge projecting upward and having an upper face and a lower end;
    a thickness of the second part is smaller than a thickness of the first part;
    the lower end of the ridge is positioned at the first part;
    the first part comprises an uppermost layer in contact with a lower face of the electron barrier layer;
    the second part comprises a lowermost layer in contact with the upper face of the electron barrier layer; and
    the lowermost layer has a band gap energy that is smaller than a band gap energy of the uppermost layer.

* * * * *